(12) United States Patent
DiBene, II et al.

(10) Patent No.: US 7,167,379 B2
(45) Date of Patent: Jan. 23, 2007

(54) MICRO-SPRING INTERCONNECT SYSTEMS FOR LOW IMPEDANCE HIGH POWER APPLICATIONS

(76) Inventors: Joseph T. DiBene, II, 19 Shasta Ct., Oceanside, CA (US) 92057; Edward J. Derian, 13134 Polvera Ave., San Diego, CA (US) 92128

( * ) Notice: Subject to any disclaimer, the term of this patent is extended or adjusted under 35 U.S.C. 154(b) by 132 days.

(21) Appl. No.: 10/428,202

(22) Filed: Apr. 30, 2003

(65) Prior Publication Data
US 2003/0183406 A1    Oct. 2, 2003

Related U.S. Application Data

(63) Continuation-in-part of application No. 10/022,454, filed on Oct. 30, 2001, now Pat. No. 6,556,455, which is a continuation-in-part of application No. 09/785,892, filed on Feb. 16, 2001, now Pat. No. 6,452,113.

(60) Provisional application No. 60/376,578, filed on Apr. 30, 2002, provisional application No. 60/388,412, filed on Jun. 12, 2002.

(51) Int. Cl.
*H01R 12/16*    (2006.01)
(52) U.S. Cl. .................. 361/785; 361/769; 439/66; 257/691
(58) Field of Classification Search ........... 361/787, 361/788, 769, 785; 439/66, 71, 44, 69; 257/691, 257/692; 174/255, 260, 267
See application file for complete search history.

(56) References Cited
U.S. PATENT DOCUMENTS

| | | |
|---|---|---|
| 3,596,138 A | 7/1971 | Lehrfeld |
| 3,854,374 A | 12/1974 | Boyle et al. |
| 4,358,503 A | 11/1982 | Homeyer |
| 4,446,173 A | 5/1984 | Barrell et al. |
| 4,498,530 A | 2/1985 | Lipschutz |

(Continued)

FOREIGN PATENT DOCUMENTS

| | | |
|---|---|---|
| EP | 0 582 145 A1 | 2/1994 |
| EP | 0 717 443 A1 | 6/1996 |
| EP | 0 910 235 A1 | 4/1999 |
| EP | 0 920 055 A2 | 6/1999 |
| FR | 2 722 334 A1 | 1/1996 |

(Continued)

OTHER PUBLICATIONS

Chung, "Ball-Grid-Array Package Thermal Management," 14th IEEE Semi-therm TM Symposium, 1998, 78-87.
XP000124263, IBM Tech Disc Bulletin, "Multiple Electronic Board . . . System," 1994, 33(3B):55-56.
IBM Corp. Technical Disclosure Bulletin, "Pin Fin Array Heat Pipe Apparatus," Sep. 1994, vol. 37, No. 9,1pp.

*Primary Examiner*—Kamand Cuneo
*Assistant Examiner*—Yuriy Semenenko
(74) *Attorney, Agent, or Firm*—Charles S. Cohen

(57) ABSTRACT

An assembly includes an electronic assembly with a microprocessor coupled to a power conversion assembly via a compliant conductor assembly. The compliant conductor assembly includes a plurality of spring conductors mounted in a carrier. Selected ones of the spring conductors are electromagnetically coupled with others of the spring conductors. Additionally, each spring conductor provides multiple conductive paths.

22 Claims, 27 Drawing Sheets

U.S. PATENT DOCUMENTS

| | | |
|---|---|---|
| 4,502,193 A | 3/1985 | Harmon et al. |
| 4,521,829 A | 6/1985 | Wessely |
| 4,589,057 A | 5/1986 | Short |
| 4,724,901 A | 2/1988 | Munekawa |
| 4,742,385 A | 5/1988 | Kohmoto |
| 4,760,495 A | 7/1988 | Till |
| 4,771,365 A | 9/1988 | Cichocki et al. |
| 4,875,140 A | 10/1989 | Delpech et al. |
| 4,942,497 A | 7/1990 | Mine et al. |
| 4,974,119 A | 11/1990 | Martin |
| 4,982,311 A | 1/1991 | Dehaine et al. |
| 5,052,481 A | 10/1991 | Horvath et al. |
| 5,065,280 A | 11/1991 | Karnezos et al. |
| 5,092,783 A * | 3/1992 | Suarez et al. ................ 439/71 |
| 5,161,089 A | 11/1992 | Chu et al. |
| 5,194,480 A | 3/1993 | Block et al. |
| 5,195,020 A | 3/1993 | Suzuki et al. |
| 5,198,889 A | 3/1993 | Hisano et al. |
| 5,216,580 A | 6/1993 | Davidson et al. |
| 5,258,887 A | 11/1993 | Fortune |
| 5,272,599 A | 12/1993 | Koenen |
| 5,312,508 A | 5/1994 | Chisolm |
| 5,315,069 A | 5/1994 | Gebara |
| 5,331,510 A | 7/1994 | Ouchi et al. |
| 5,343,358 A | 8/1994 | Hilbrink |
| 5,345,366 A | 9/1994 | Cheng et al. |
| 5,355,282 A | 10/1994 | Yokemura et al. |
| 5,359,493 A | 10/1994 | Chiu |
| 5,365,402 A | 11/1994 | Hatada et al. |
| 5,380,211 A | 1/1995 | Kawaguchi et al. |
| 5,386,143 A | 1/1995 | Fitch |
| 5,390,078 A | 2/1995 | Taylor |
| 5,396,403 A | 3/1995 | Patel |
| 5,409,055 A | 4/1995 | Tanaka et al. |
| 5,413,489 A | 5/1995 | Switky |
| 5,460,543 A | 10/1995 | Kosmala |
| 5,467,251 A | 11/1995 | Katchmar |
| 5,473,510 A | 12/1995 | Dozier, II |
| 5,504,924 A | 4/1996 | Ohashi et al. |
| 5,510,958 A | 4/1996 | Shimabara et al. |
| 5,515,241 A | 5/1996 | Werther |
| 5,515,912 A | 5/1996 | Daikoku et al. |
| 5,520,976 A | 5/1996 | Giannetti et al. |
| 5,544,004 A * | 8/1996 | Inagaki et al. ............... 361/633 |
| 5,544,017 A | 8/1996 | Beilin et al. |
| 5,545,473 A | 8/1996 | Ameen et al. |
| 5,586,011 A | 12/1996 | Alexander |
| 5,591,034 A | 1/1997 | Ameen et al. |
| 5,608,610 A | 3/1997 | Brzezinski |
| 5,617,300 A | 4/1997 | Anzawa et al. |
| 5,619,399 A | 4/1997 | Mok |
| 5,621,615 A | 4/1997 | Dawson et al. |
| 5,632,158 A | 5/1997 | Tajima |
| 5,646,826 A | 7/1997 | Katchmar |
| 5,647,430 A | 7/1997 | Tajima |
| 5,655,913 A * | 8/1997 | Castaneda et al. ............ 439/66 |
| 5,661,902 A | 9/1997 | Katchmar |
| 5,694,297 A | 12/1997 | Smith et al. |
| 5,704,416 A | 1/1998 | Larson et al. |
| 5,708,566 A | 1/1998 | Hunninghaus et al. |
| 5,721,454 A | 2/1998 | Palmer |
| 5,729,433 A | 3/1998 | Mok |
| 5,734,555 A | 3/1998 | McMahon |
| 5,738,936 A | 4/1998 | Hanrahan |
| 5,754,412 A | 5/1998 | Clavin |
| 5,761,043 A | 6/1998 | Salmonson |
| 5,770,891 A | 6/1998 | Frankeny et al. |
| 5,783,316 A | 7/1998 | Colella et al. |
| 5,786,075 A | 7/1998 | Mishuku et al. |
| 5,794,454 A | 8/1998 | Harris et al. |
| 5,796,582 A | 8/1998 | Katchmar |
| 5,800,905 A | 9/1998 | Sheridan et al. |
| 5,801,924 A | 9/1998 | Salmonson |
| 5,815,921 A | 10/1998 | Burward-Hoy |
| 5,825,630 A | 10/1998 | Taylor et al. |
| 5,825,633 A | 10/1998 | Bujalski et al. |
| 5,842,514 A | 12/1998 | Zapach et al. |
| 5,856,911 A | 1/1999 | Riley |
| 5,864,466 A | 1/1999 | Remsberg |
| 5,864,478 A | 1/1999 | McCutchan et al. |
| 5,898,573 A | 4/1999 | Fugaro |
| 5,904,796 A | 5/1999 | Freuler et al. |
| 5,905,638 A | 5/1999 | MacDonald, Jr. et al. |
| 5,920,458 A | 7/1999 | Azar |
| 5,930,115 A | 7/1999 | Tracy et al. |
| 5,945,217 A | 8/1999 | Hanrahan |
| 5,956,835 A | 9/1999 | Aksu |
| 5,966,294 A | 10/1999 | Harada et al. |
| 5,974,662 A | 11/1999 | Eldridge et al. |
| 5,980,267 A * | 11/1999 | Ayers et al. .................. 439/60 |
| 5,981,869 A | 11/1999 | Kroger |
| 5,982,635 A | 11/1999 | Menzies et al. |
| 5,986,887 A | 11/1999 | Smith et al. |
| 5,995,370 A | 11/1999 | Nakamori |
| 6,014,313 A | 1/2000 | Hesselbom |
| 6,018,465 A | 1/2000 | Borkar et al. |
| 6,031,727 A | 2/2000 | Duesman et al. |
| 6,037,659 A | 3/2000 | Weixel |
| 6,062,302 A | 5/2000 | Davis et al. |
| 6,092,281 A | 7/2000 | Glenn |
| 6,096,414 A | 8/2000 | Young |
| 6,101,094 A | 8/2000 | Kermaani et al. |
| 6,131,646 A | 10/2000 | Kelley |
| 6,137,693 A | 10/2000 | Schwiebert et al. |
| 6,157,544 A | 12/2000 | Ferling et al. |
| 6,191,475 B1 | 2/2001 | Skinner et al. |
| 6,191,945 B1 | 2/2001 | Belady et al. |
| 6,222,265 B1 | 4/2001 | Akram et al. |
| 6,225,566 B1 | 5/2001 | Dienst |
| 6,226,179 B1 | 5/2001 | Lee |
| 6,231,352 B1 | 5/2001 | Gonzales |
| 6,237,223 B1 | 5/2001 | McCullough |
| 6,241,531 B1* | 6/2001 | Roath et al. .................. 439/66 |
| 6,262,887 B1 | 7/2001 | Lee |
| 6,265,672 B1 | 7/2001 | Eum et al. |
| 6,285,550 B1 | 9/2001 | Belady |
| 6,297,551 B1 | 10/2001 | Dudderar et al. |
| 6,303,989 B1 | 10/2001 | Yasuho et al. |
| 6,304,450 B1 | 10/2001 | Dibene, II et al. |
| 6,338,634 B1 | 1/2002 | Yu |
| 6,341,066 B1 | 1/2002 | Murowaki et al. |
| 6,347,042 B1 | 2/2002 | White |
| 6,347,044 B1 | 2/2002 | Won et al. |
| 6,351,392 B1 | 2/2002 | Palaniappa |
| 6,352,203 B1 | 3/2002 | Brainard et al. |
| 6,354,844 B1 | 3/2002 | Coico et al. |
| 6,356,448 B1 | 3/2002 | DiBene, II et al. |
| 6,359,783 B1 | 3/2002 | Noble |
| 6,360,431 B1 | 3/2002 | Harrison et al. |
| 6,390,829 B1 | 5/2002 | Rademacher |
| 6,392,899 B1 | 5/2002 | Harrison et al. |
| 6,399,887 B1 | 6/2002 | Lin |
| 6,493,233 B1 | 12/2002 | De Lorenzo et al. |
| 6,523,253 B1 | 2/2003 | Harrison et al. |
| 6,532,157 B1 | 3/2003 | Glenn et al. |
| 2002/0040811 A1 | 4/2002 | Harrison et al. |
| 2002/0042214 A1 | 4/2002 | Harrison et al. |
| 2002/0105791 A1 | 8/2002 | Harrison et al. |

FOREIGN PATENT DOCUMENTS

| | | |
|---|---|---|
| JP | 57066654 | 4/1982 |
| JP | 58175851 | 10/1983 |
| JP | 1174427 | 7/1989 |

| JP | 03041753 | 2/1991 | WO | WO 01/33927 A1 | 5/2001 |
| JP | 08204304 | 8/1996 | WO | WO 01/65344 | 9/2001 |
| JP | 08330699 | 12/1996 | WO | WO 01/67512 | 9/2001 |
| WO | WO 96/23397 | 8/1996 | | | |
| WO | WO 01/06821 A1 | 1/2001 | | | |

\* cited by examiner

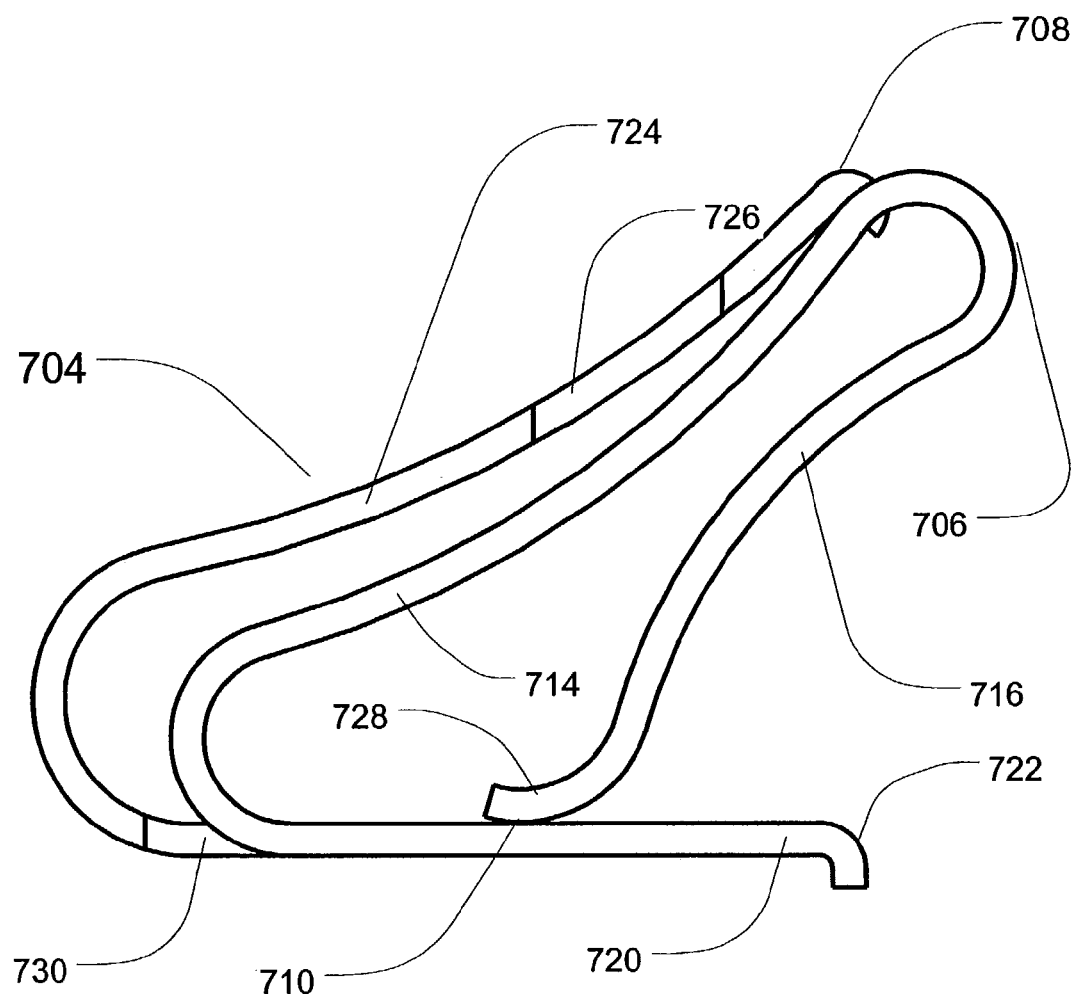
FIG. 7D
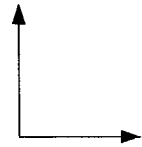

MICRO-SPRING INTERCONNECT SYSTEMS FOR LOW IMPEDANCE HIGH POWER APPLICATIONS

CROSS-REFERENCE TO RELATED APPLICATIONS

This application claims benefit of the following U.S. Provisional Patent Applications, each of which are incorporated by reference herein:

No. 60/376,578: Method and Apparatus for Surface Power Delivery, Derian, E., et. al.—(Provisional Patent) filed—Apr. 30, 2002; and No. 60/388,412:Micro-Spring Interconnect Systems for Low Impedance High Power Applications, DiBene, et. al.—(Provisional Patent) filed—Jun. 12, 2002.

This application is a continuation in part of application Ser. No. 10/022,454 field Oct. 30, 2001 now U.S. Pat. No. 6,556,455 titled Ultra-Low Impedance Power Interconnection System for Electronic Packages which is a continuation in part of application Ser. No. 09/785,892, filed Feb. 16, 2001, now U.S. Pat. No. 6,452,113, each of which are hereby incorporated by reference.

BACKGROUND OF THE INVENTION

1. Field of the Invention

This invention relates to methods and systems for low inductance, high current, disconnectable power interconnection which can be used to provide connections between voltage regulating circuits and devices such as microprocessors.

2. Description of the Related Art

Microprocessors and other high performance devices require very low impedance interconnection systems for delivery of high current and high current slew-rates for delivery of power from voltage regulators. Voltage regulators include power conditioners, dc to dc converters, and other circuits which provide power. Often, this interconnection system necessitates that the power source is located very close to the substrate of the device and delivery of power from the interconnection system is accomplished by directly interconnecting to the substrate itself. Thus, it is seen that there is a need to interconnect directly to the surface of the substrate itself. Moreover, area, inductance, resistance, and other parameters are very important and vary from one application to another—for example, desktop and server microprocessor systems have different application needs. Therefore, additionally it is seen that there is a need to have a variety of interconnection systems which meet the needs for various high performance electronic systems.

SUMMARY OF THE INVENTION

The present invention addresses the need for delivery of power for high performance electronic devices, such as microprocessors, through the construction of a low impedance, small form factor power interconnection system.

In one respect the instantiations described herein comprise compliant conductors arranged in such a way as to increase electromagnetic field coupling between pairs of sets of conductors while simultaneously addressing the need to provide a small form factor which reduces cost and volumetric space in high performance electronic systems.

BRIEF DESCRIPTION OF THE DRAWINGS

Referring now to the drawings in which like reference numbers represent corresponding parts throughout:

FIG. 7D is a side view of a single triple beam.

DETAILED DESCRIPTION

In the following description, reference is made to the accompanying drawings which form a part hereof, and in which is shown, by way of illustration, several embodiments of the present invention. It is understood that other embodiments may be utilized and changes may be made without departing from the scope of the present invention.

Figure 8A:
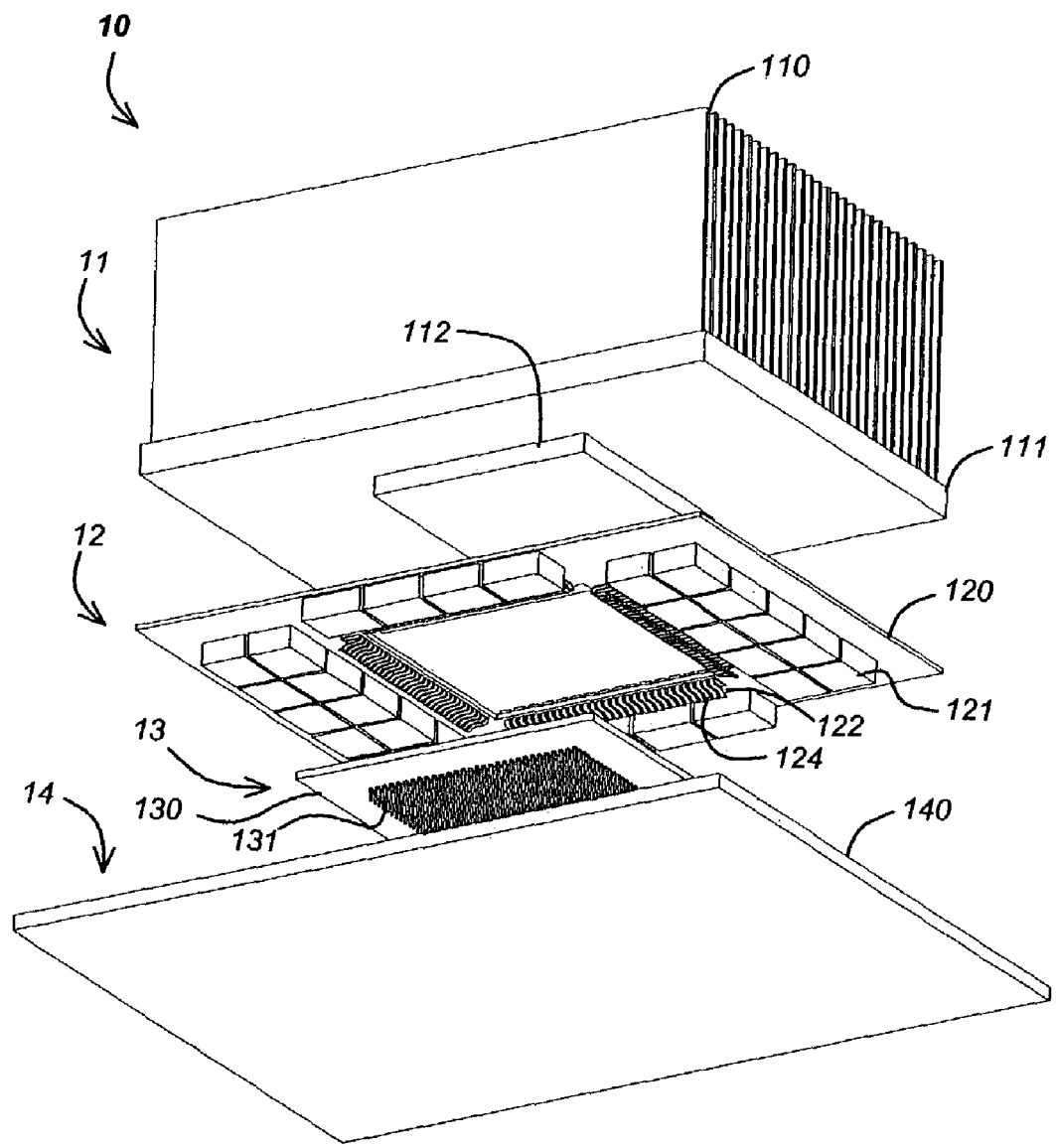
FIG. 8A is an exploded perspective view of an electronic assembly.
Figure 8B:
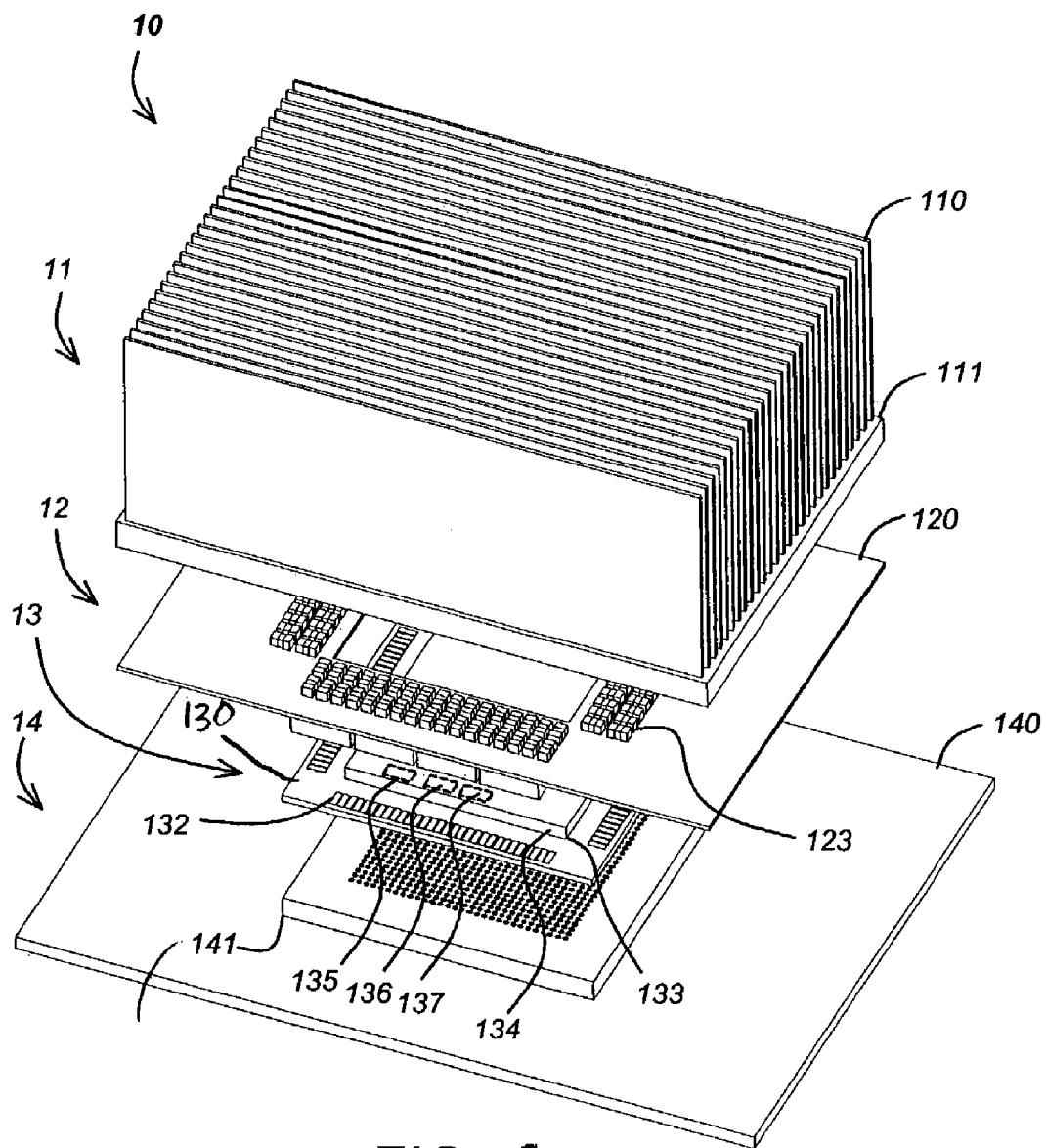
FIG. 8B is an exploded view of the electronic assembly of FIG. 8A from the opposite perspective.

Referring first to FIGS. 8A and 8B, an example of a structure will be described which includes a power path from a power conditioning circuit to a high performance electronic power dissipating device via a plurality of paths, thus yielding very low impedance. Other examples and further descriptions of such assemblies can be found in the patents incorporated by reference above.

The structure 10 shown in FIGS. 8A–8B is shown in an exploded view. The structure 10 comprises a main board assembly 14, an electronic assembly 13 having a high performance electronic power dissipating device, a power conversion assembly 12 and a heat dissipating assembly 11.

The electronic assembly 13 comprises a power dissipating device such as a microprocessor 134 assembled onto printed circuit board (PCB) or substrate 130 (hereinafter, the terms "printed circuit board", "circuit board" and "substrate" are used interchangeably). The circuit board 130 includes one or more circuit traces which deliver power to the die of the microprocessor 134. The circuit board 130 also includes circuit traces which route signals to a matrix of pins 131 communicatively coupled to microprocessor 134 I/O connectors. The microprocessor 134 is typically provided with a thermally conductive lid 133 in which the inside surface of the lid is in close thermal contact with the top of the die of the electronic device and the perimeter of the lid is sealed and attached to the surface of the substrate 130. Although the package described herein is provided with a lid, unlidded package can be used.

The signal pins 131 engage with a socket 141 which is mounted to a main board 140 both of which are a part of main board assembly 14. Signals from the main board assembly 14 are dispersed to other electronic devices to form a complete operating unit such as a computer. Other methods may be employed to route the signals from the substrate 130 to the main board 140 which may not utilize either pins or sockets.

The substrate 130 includes a plurality of contacts or pads 132. The contacts 132 can include power contacts and/or ground contacts. The power and ground contacts are communicatively coupled to power connectors or pads 135–137 of the power dissipating device 134, respectively.

Figure 8C:
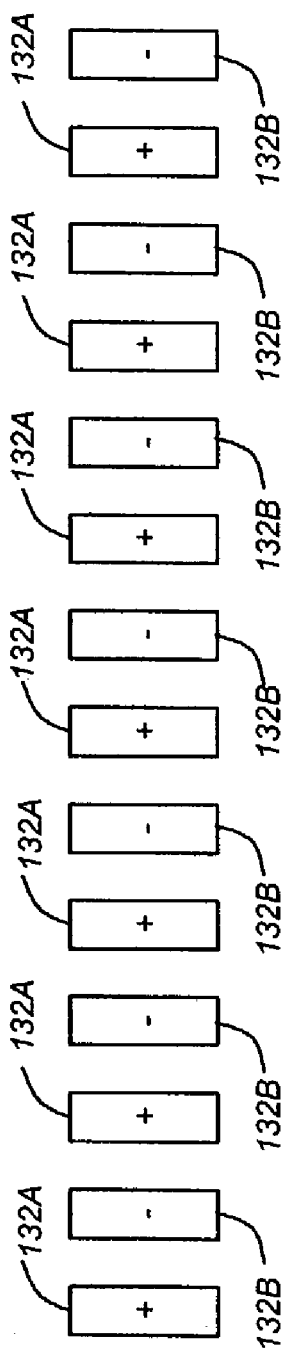
FIGS. 8C–8E are depictions of contact pad arrangements.
Figure 8D:
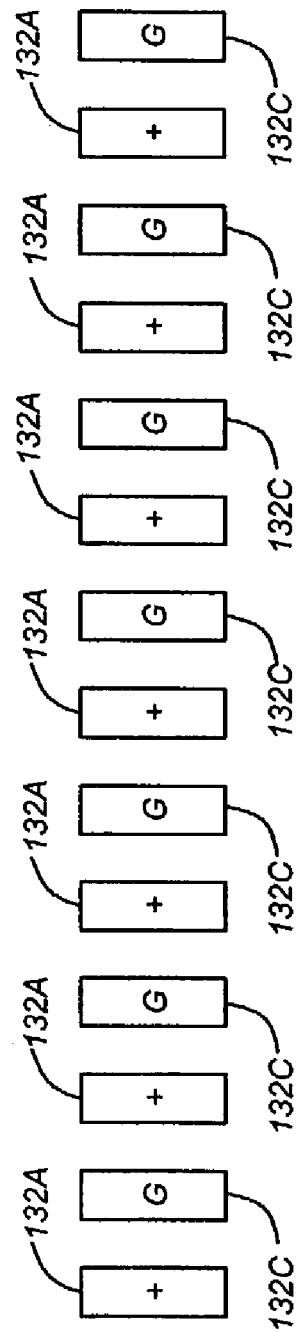
Figure 8E:
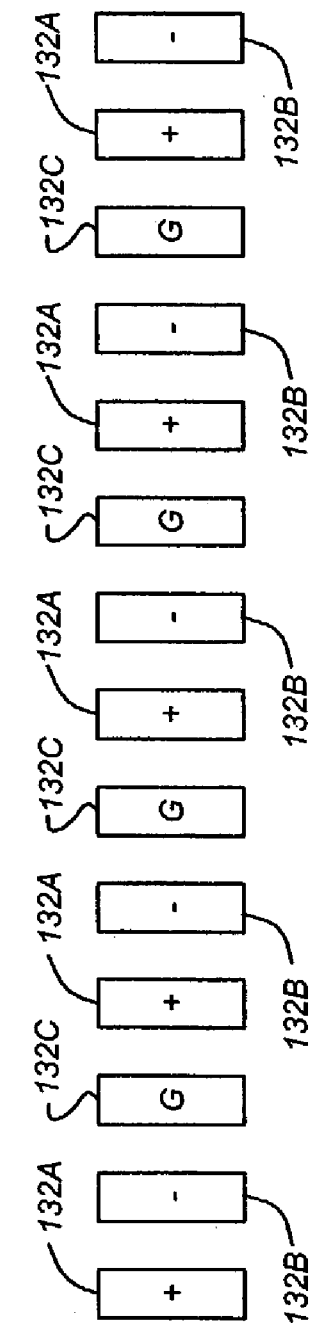

FIGS. 8C–8E disclose several alternative arrangements of the contacts 132. In one embodiment, the power contacts include positive polarity power contacts 132A that are communicatively coupled to a positive polarity power connector or pad 135 on the power dissipating device 134 and negative polarity power contacts 132B that are communicatively coupled to a negative polarity power connector or pad 136 on the power dissipating device 134. The ground contacts 132C are communicatively coupled to a ground connector or pad 137 of the power dissipating device 134.

In one embodiment (illustrated in FIGS. 1D and 1E), the power contacts 132A and/or 132B are interleaved with the ground contacts 132C. In FIG. 8D, each power contact 132A and/or 132B is adjacent a ground contact 132C, and each ground contact 132C is adjacent a power contact 132A and/or 132C. In another embodiment of the present invention, the positive polarity power contacts 132A are interleaved with negative polarity power contacts 132B in the same way. The foregoing interleaved or alternating design substantially reduces undesirable electrical impedance of the power path.

In the configuration shown in FIGS. 8A and B, the contacts 132 are disposed around the perimeter of the electronic device and are a part of the substrate structure 130.

The substrate 130 generally comprises a number of conductive layers that are used to route both signals and power and ground. When routing power, layer pairs adjacent to each other form a very low electrical interconnect impedance between the power pads 132 and the die power and/or ground connectors (e.g. pads) of the electronic device 134. These layer pairs are connected to the power pads 132 in a closely coupled arrangement to the planes.

A power conversion assembly 12 is disposed above (along the z-axis) the electronic assembly 13. This power conversion assembly 12 comprises an interconnect substrate commonly referred to as a printed circuit board (PCB) 120, a power conversion circuit having components 121 such as switching transistors, transformers, inductors, capacitors, and control electronics; output capacitors 123 and a compliant conductor assembly 122 having a plurality of z-axis compliant conductors 124. These power conversion components can be segmented according to the Voltage Regulator Module ("VRM") circuit topology to optimize the impedance and power flow through the power conditioning circuitry. For example, in the case of a multiphase VRM, the topology of the VRM can be designed to provide one or more of the phases, each at the appropriate connector, thus minimizing the interconnect impedance and the required circuit board real estate. In addition, as will be explained in further detail below, the conductors can be coupled to different polarities and ground to achieve electromagnetic coupling between selected conductors.

The plurality of z-axis compliant conductors 124 circumscribe and interface with the contacts 132 on the electronic assembly 13 to provide a conductive path between the power conversion assembly 12 and the electronic assembly 13. When assembled, the compliant conductors are compressed between the substrate 120 and the substrate 130 to provide a reliable contact with the contacts 132. Further, the conductor assembly 122 permits the power conversion assembly 12 and the electronic assembly 13 to be disassembled and separated without desoldering.

In the illustrated embodiment, the conductors 124 of the conductor assembly 122 are attached (e.g. soldered or bonded) to the substrate 120. Further, the conductors 124 of the conductor assembly 122 are electrically coupled to the contacts 132 of substrate 130 through mechanical pressure applied to urge the substrate 120 towards the substrate 130. Alternatively, the conductor assembly can be attached to substrate 130 with corresponding contact pads being placed on substrate 120. However, for ease of description, the following examples focus on the other arrangement.

Other variations of this structure are possible. As an example, the compliant conductor assembly 122 could be permanently attached to substrate 130 with contact pads on substrate 120 or, contact pads could be place on both substrates 120 and 130 and the compliant contact could provide pressure contacts to both substrates. Note that some of the interconnect compliant contacts may be used for control and sense interfaces between the power circuitry in assembly 12 and the electronic assembly 13. Finally, note that substrate 120 has an aperture to allow for the lid 133 to pass through and thermally couple to the heatsink assembly 11. Further examples of the compliant conductor assembly and additional details will be provided in connection with the description of FIGS. 1–7.

In the past, it has been necessary to position bypass capacitors on substrate 130 to provide for the transient current demands of the electronic device on the substrate. This has reduced the reliability of the electronic assembly 12 which is relatively much more expensive than the other assemblies. Thus, it is desirable to increase the reliability of this assembly to the highest degree possible. Because the interconnect inductance of the compliant contacts 122 is extremely low it is possible to position the necessary bypass capacitors 123 on the power conversion substrate 120. Further, note that these capacitors 123 can be located directly above the conductor assembly 122 reducing the interconnect path length between the connector and the capacitors 123 (thus decreasing the impedance) to approximately the thickness of the substrate 120.

Heatsink assembly 11 is used to remove heat from both the electronic assembly 13 and the power conversion assembly 12. Heatsink assembly 11 comprises a finned structure 100, which is attached or is a part of base 111. Heat slug or mesa 112 is attached to or is a part of base 111 and is used to both disperse heat from the lid 122 and to mechanically conform to the proper vertical displacement between the lid of the microprocessor 134 and the heat sink base 111. Thermal interface materials may be used to thermally couple the lid 133 and the mesa 112 to the heatsink base 111 and the substrate 120/power components 121. The heatsink base 111 may also comprise cavities to accommodate any components on the top side of substrate 120 such as capacitors 123.

Figure 1A:
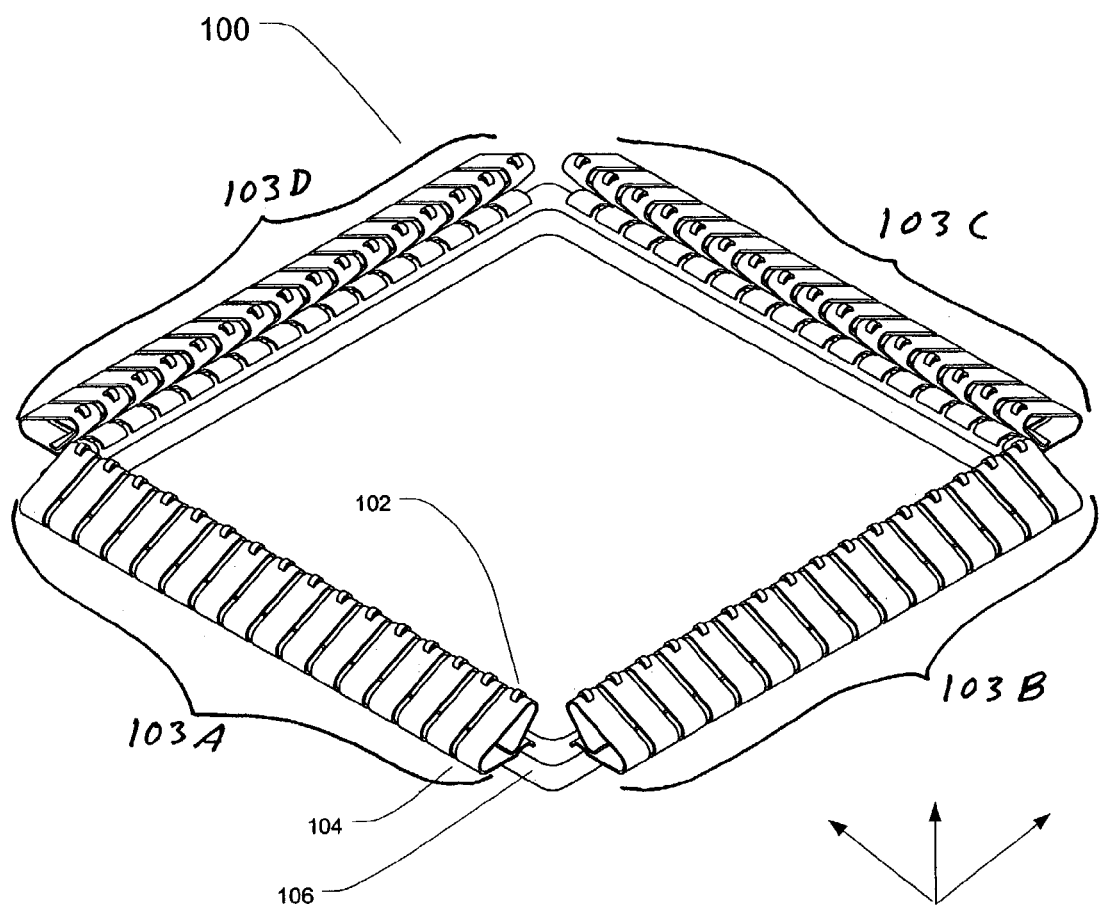
FIG. 1A is an isometric view of a series of loop springs placed in a set of four arrays where the spring arrays are arranged circumferentially in a carrier.
Figure 1B:
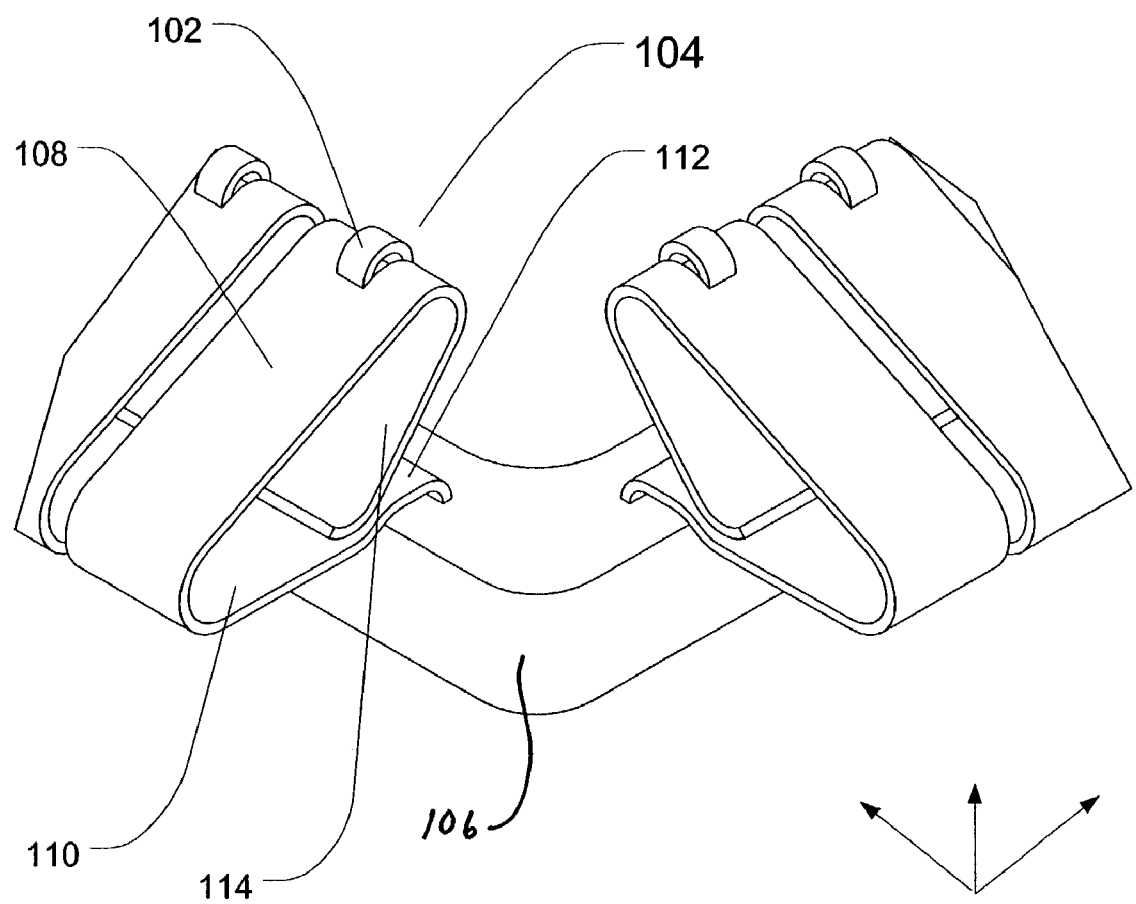
FIG. 1B is a detailed view of a section of the spring array shown in FIG. 1A.

FIG. 1A shows a first embodiment of the compliant conductor assembly or interconnection system utilizing an inline micro-spring connection system which can be used in the assembly shown in FIGS 1A–1B as conductor assembly 122. Interconnection system 100 comprises a series of isolated individual compliant conductors, such as in-line loop conductor 104. A series or group of the loop conductors form an array of loop conductors identified as arrays 103A–D. The loop conductors in each array can be coupled to ground, power, positive power and negative power, for example, in the patterns described in connection with FIGS. 1C–E.

The conductors are placed in a carrier 106 which is placed in the PCB 120 (See, FIGS. 8A–B). Other systems for retaining and holding the conductors arrays may be used. Such systems include carriers which hold only portions of the arrays, such as one side at a time, or a sub-set of an array for ease in handling as well as manufacturing and assembly to a printed circuit board.

The in-line loop conductors such as conductor 104 may be used for interconnection of signals as well such as power control between a microprocessor and a voltage regulator module where the conductor arrays may reside.

Each conductor 104 has a raised contact region or point 102, which is intended to make intimate contact to a corresponding pad on the substrate 130 (See FIGS. 8A–B) which has pads arranged to mate electrically and mechanically with the conductors.

FIG. 1B shows an enlarged partial view of the assembly shown in FIG. 1A. In-line loop conductor 104 has a raised contact point 102 which mates with a pad on the substrate or printed circuit board. The conductor includes a primary beam 108 which extends to or is joined to a secondary beam 114. A base 110 extends from the end of the primary beam 108 opposite the secondary beam 114. The base 110 is electrically coupled to the printed circuit board, such as by solder. Section 112 extends from the base and is an elevated section of the in-line loop conductor 104 which is mechanically joined with the carrier 106. Each of the conductors, in this and the other examples, can be made from a single piece of metal, multiple pieces of metal suitably joined together or other suitable mixtures of conductive materials.

Figure 1C:
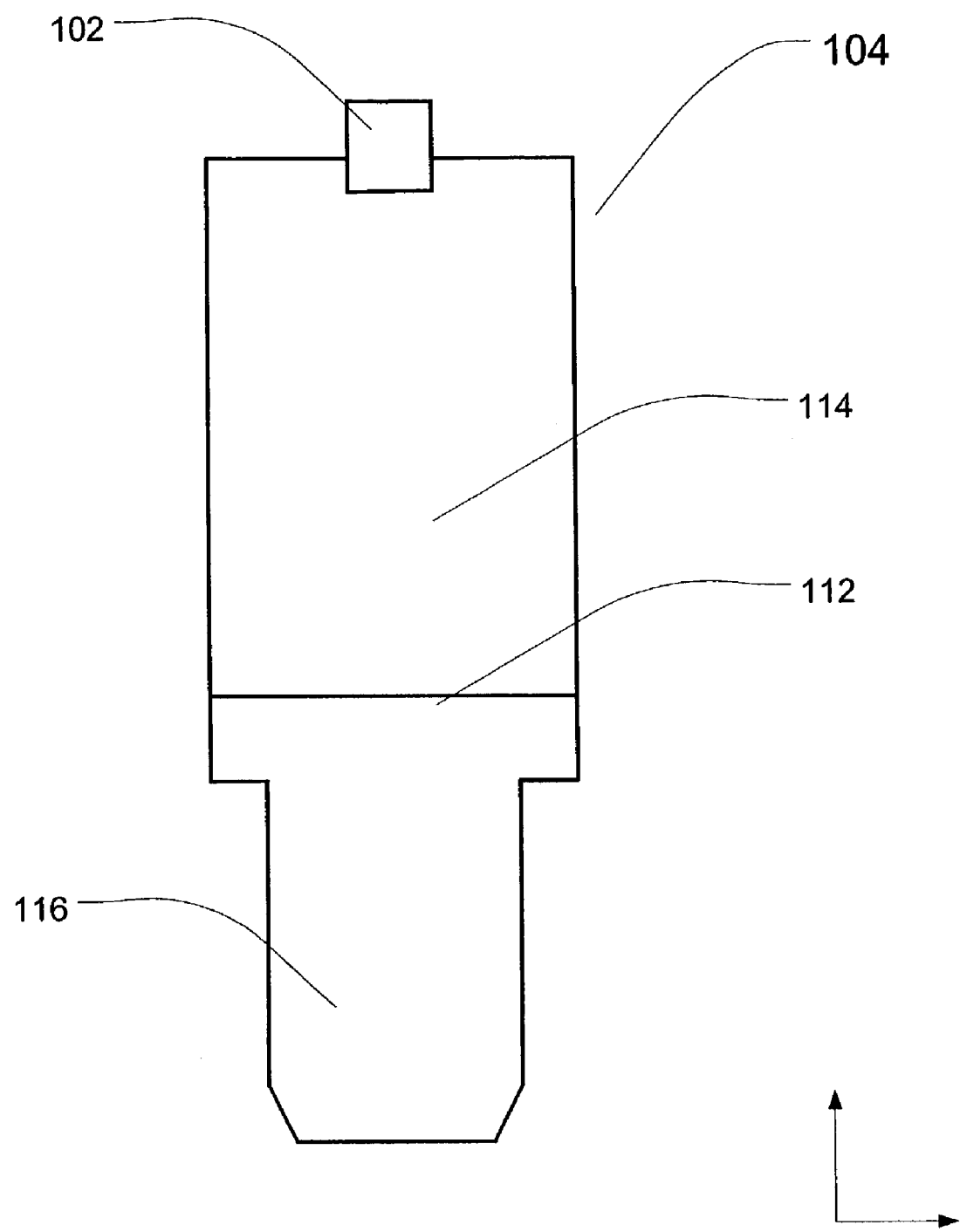
FIG. 1C is a front view of a single loop conductor.

FIG. 1C is a front view of the in-line loop conductor 104 without the carrier present. A tab 116 is typically inserted into carrier 106 for mounting. Tab 116 may be of different shapes, angles, etc. for holding and joining the in-line loop conductor 104 to the carrier 106.

Figure 1D:
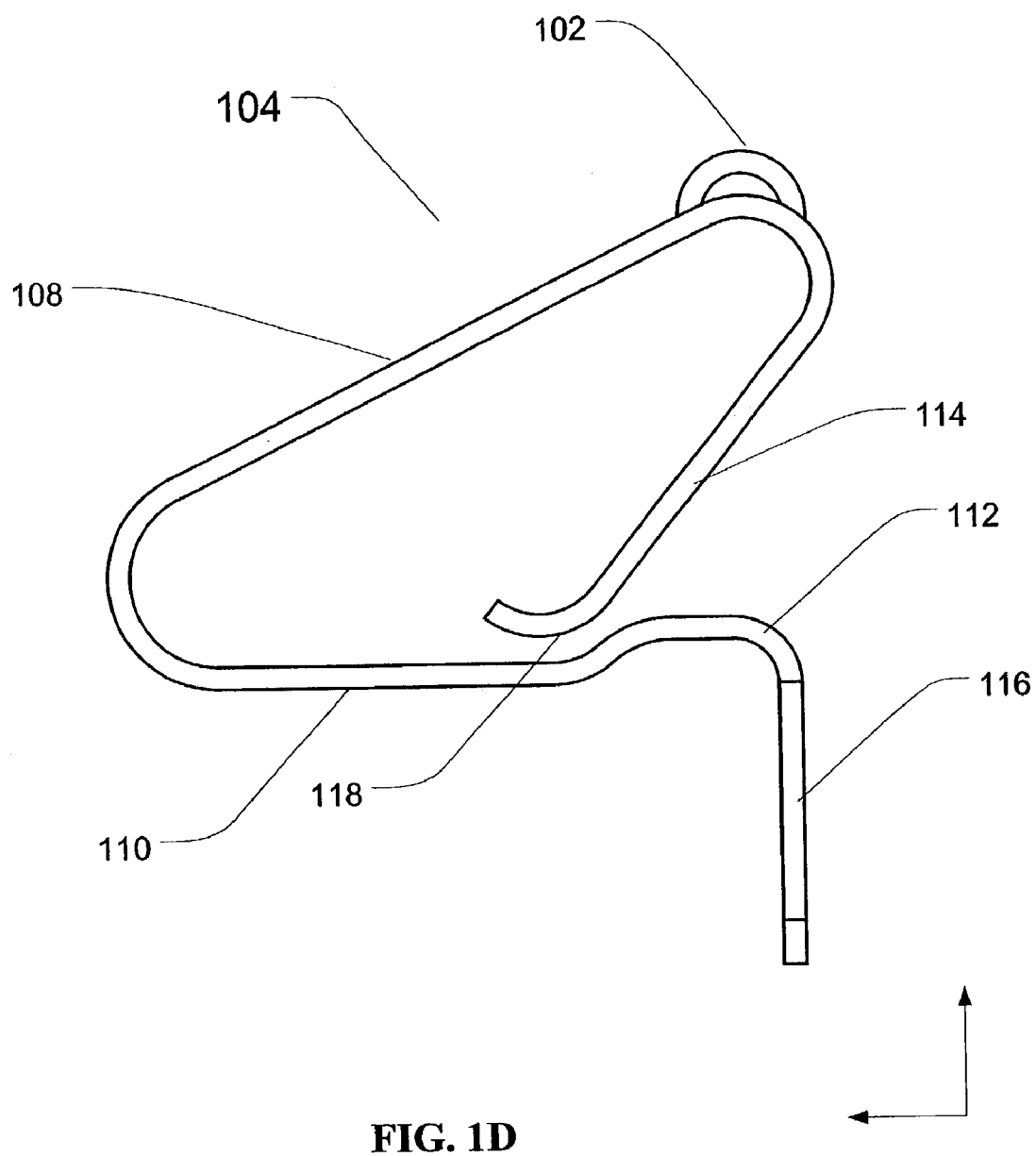
FIG. 1D is a side view of a single loop conductor.

FIG. 1D is a side view of the in-line loop conductor 104 further illustrating the conductor construction. Secondary beam contact point 118 is located near the end of the secondary beam 114 opposite the end joined to the primary beam 108. The contact point mates with the base 110 of the in-line loop conductor 104 to make additional electrical and mechanical contact when the conductor is compressed. An additional conductive loop or path extends from the contact point 102, through the secondary beam 114 to the secondary contact point 118 which contacts the base 110 when the conductor 102 is compressed. This additional loop can reduce the overall inductance of the interconnection system 100. The addition of the extra conductive path can provide an additional AC current path whereby the electric field coupling between individual in-line loop conductors is increased thereby reducing the effective inductance of the interconnection system.

Figure 2A:
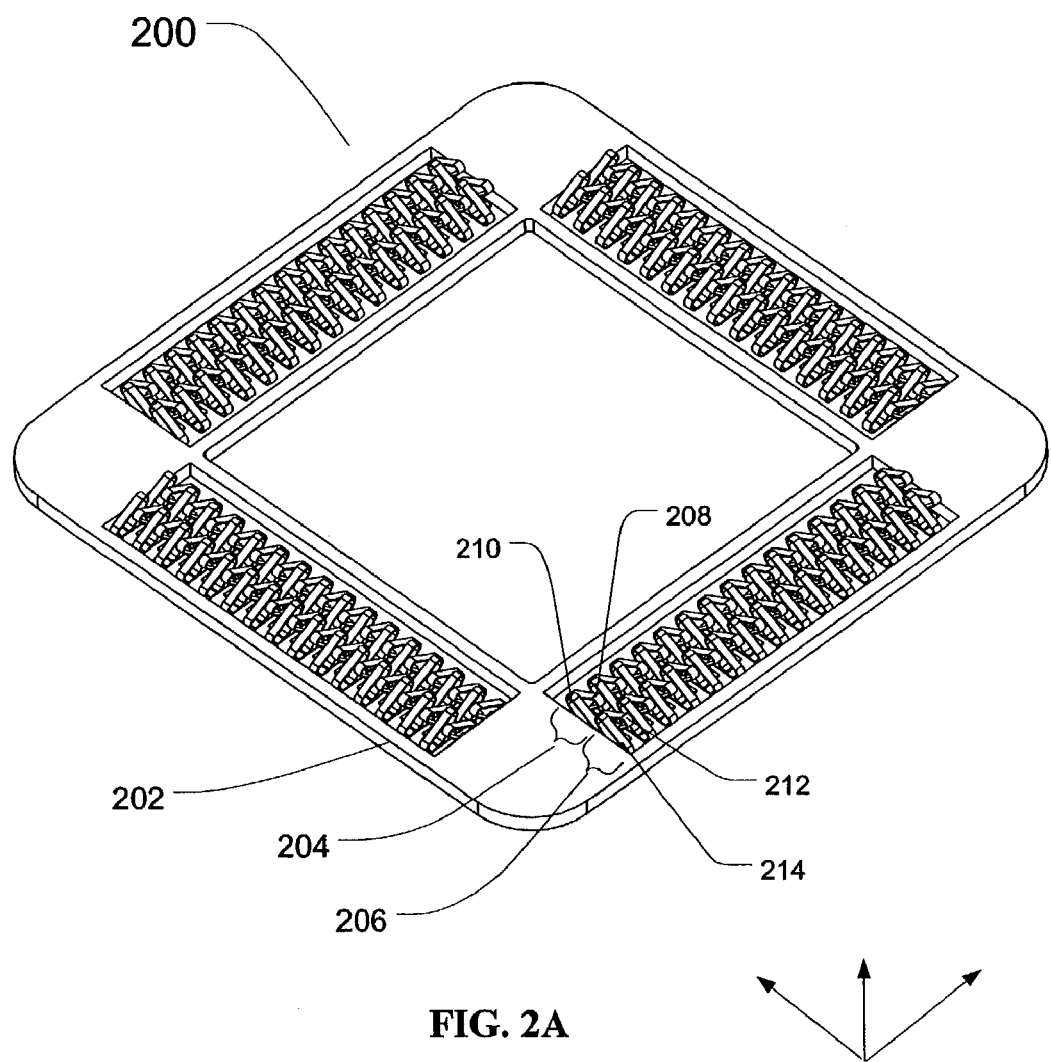
FIG. 2A is an isometric view of a series of loop springs placed in a set of four arrays or double row arrangement where the spring arrays are placed circumferentially in a carrier and where the loop conductors are aligned in a scissor arrangement where the conductors are inter-digitated in a dual row fashion.

FIG. 2A shows another example of a micro-spring arrangement for a conductor assembly. Micro-spring assembly 200 includes a double-row arrangement using the loop-conductor as a basic building block. The conductors are arranged in a scissor-like alignment for mechanical and electrical reasons. All conductors are placed in a carrier 202, but this need not be so. The conductors may be placed as individual conductors, linear array sets, or as joined arrays with or without the carrier 202. For example, the conductors can be attached directly to the PCB 120 or substrate 130 of FIG. 8A.

Figure 2B:
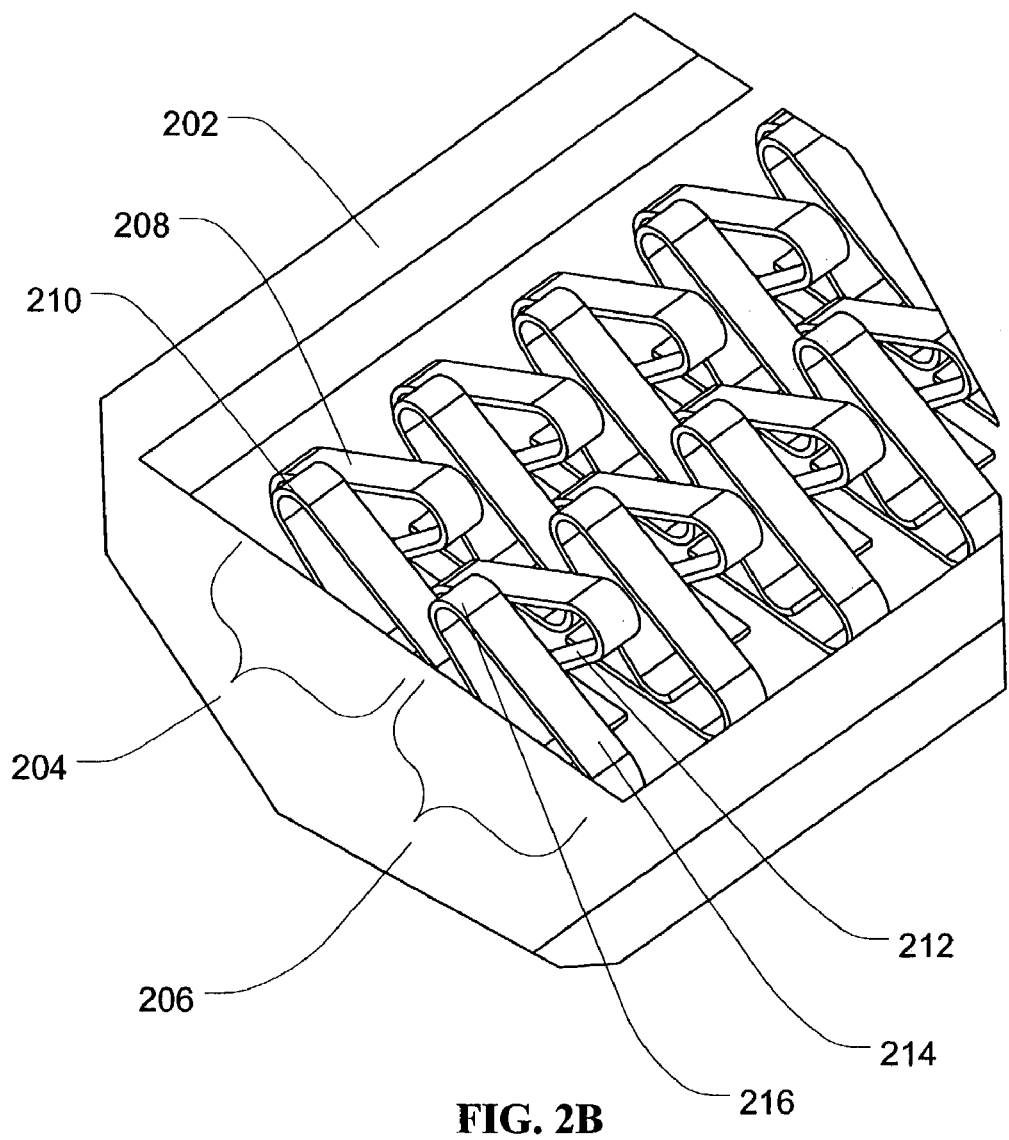
FIG. 2B is a detailed view of a section of the spring arrays shown in FIG. 2A.

Each side of the assembly 200 includes a first dual-array 204 and a second dual array 206. Each dual array includes loop conductors such as 208 and 210 or 212 and 214 which are arranged in a scissor like configuration. FIG. 2B is an enlarged view of a portion of the micro-spring assembly 200. Loop conductor 208 can be electromagnetically coupled to loop conductor 210 in array 204 while loop conductor 212 can be electromagnetically coupled to loop conductors 214. Also note that loop conductors 210 and 212 are also electromagnetically coupled. This allows for coupling of the two arrays. This infers that conductors 210 and 214 are of the same electric potential while conductors 208 and 212 are on another potential. When that is the case, the coupling between conductors 210 and 212 provides coupling between array 204 and array 206. Other variations of selecting the electric potential of such conductors may be used if the advantage of the electromagnetically coupling is not desired.

An advantage of the scissor arrangement is that common bus bar type pads may be used to form the complementary contacts on the substrate, such as substrate 130 in FIG. 1A. The bus bar pads can be formed as lines. Such bus bar type pads can be used since each alternate array lines up mechanically with the other. This is described in detail in the patent and application incorporated by reference above.

Figure 2C:
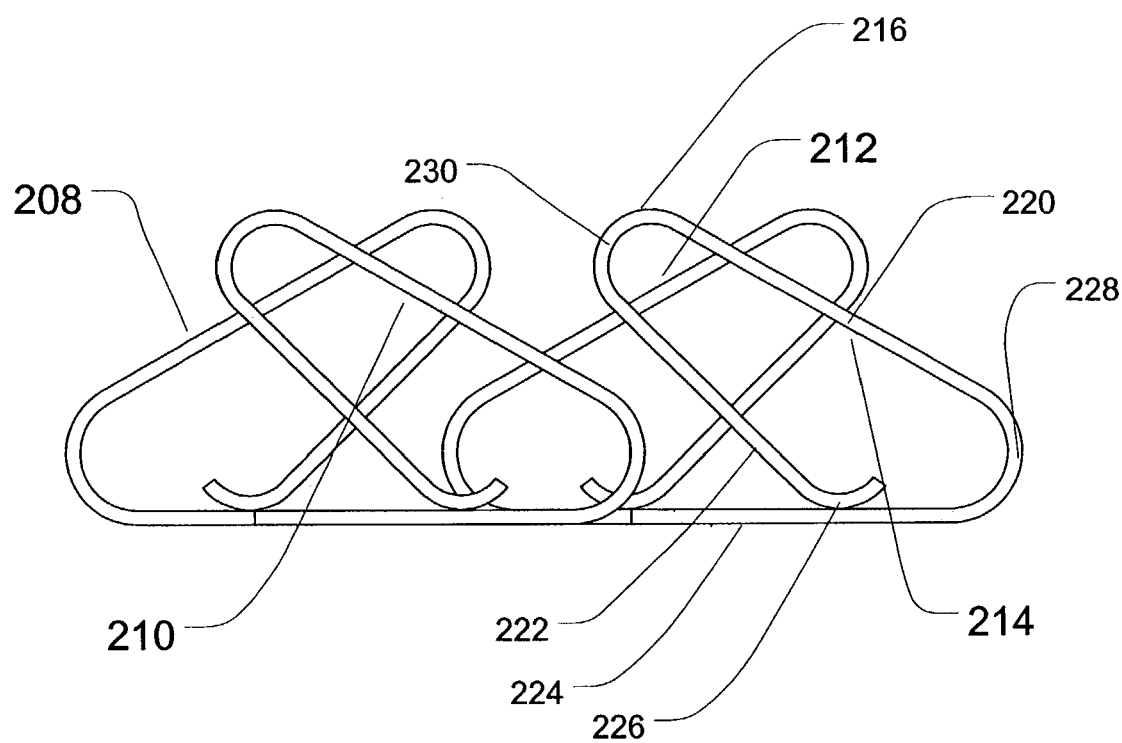
FIG. 2C is a side view of the two sets of pairs of inter-digitated arrays placed in a scissor arrangement.

FIG. 2C is a side view of the conductors shown in FIGS. 2A and 2B without the carrier present. Referring particularly to loop conductor 214 in FIG. 2C the elements of each loop conductor will be described using loop conductor 214 as the example. Loop conductor 214 has a base 224 which is typically soldered to a printed circuit board. The base may also be common with other conductors in the array for ease in manufacturing such as when a series of loop conductors is formed from a single sheet of metal. As with the example described in connection with FIG. 1A, the loop conductor makes electrical and mechanical connections at primary contact point 216 and secondary contact point 226 when compressed. A primary beam 220 actuates from end 228 while a secondary beam 222 actuates from end 230. This actuation mechanism allows for better control of overall conductor forces during compression of the spring arrays.

When loop conductor 208 and 212 have the same electrical potential and loop conductors 210 and 214 have the same electrical potential loop conductor 208 is electromagnetically coupled with loop conductor 210. Loop conductor 212 is electromagnetically coupled with loop conductor 214. In addition the two arrays are electromagnetically coupled through the coupling of loop conductor 212 with loop conductor 210.

Figure 3A:
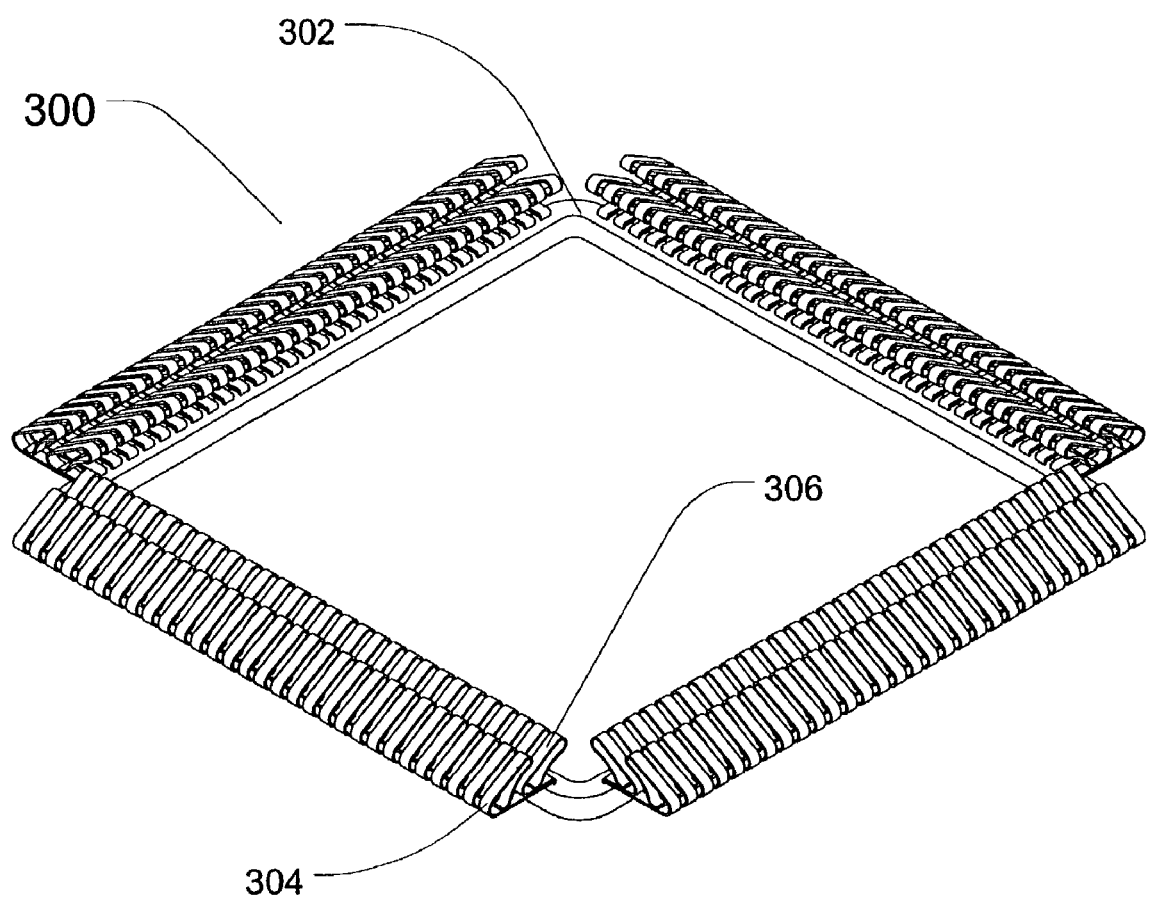
FIG. 3A is an isometric view of series of loop conductors arranged in a double-row in-line arrangement.
Figure 3B:
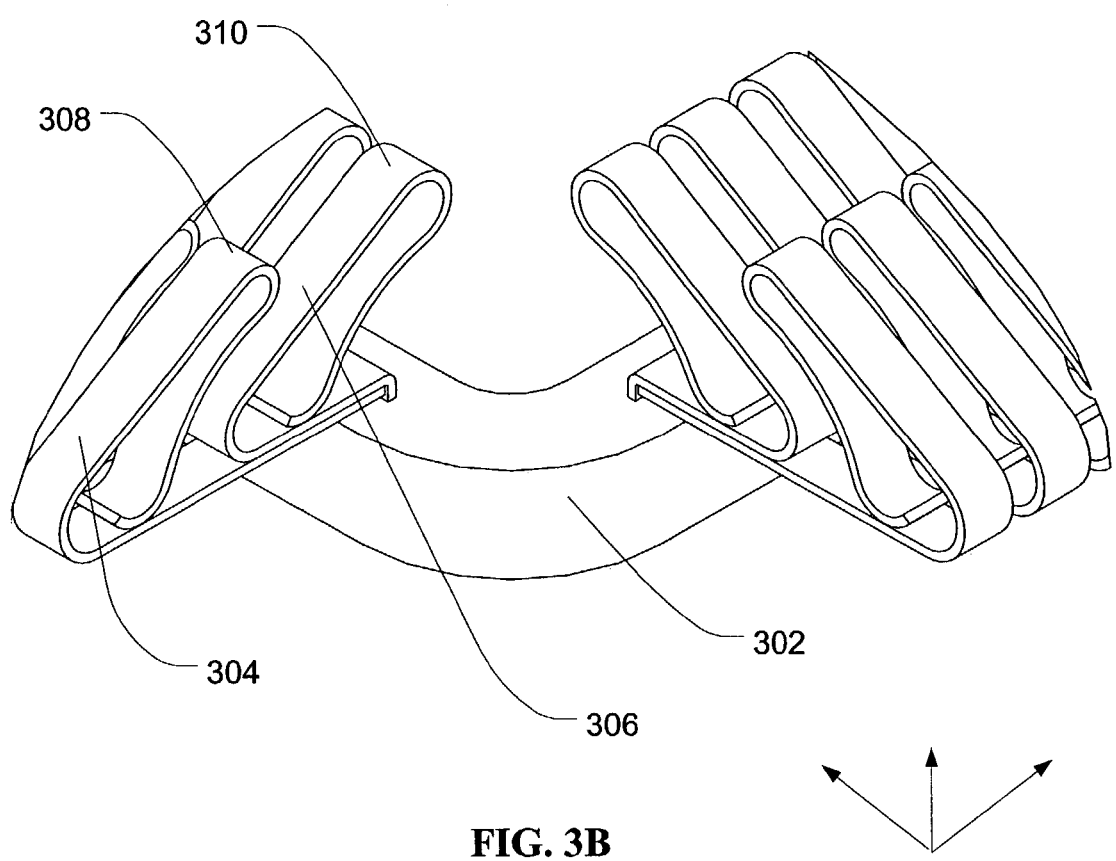
FIG. 3B is a detailed view of a section of the spring array shown in FIG. 3A.
Figure 3C:
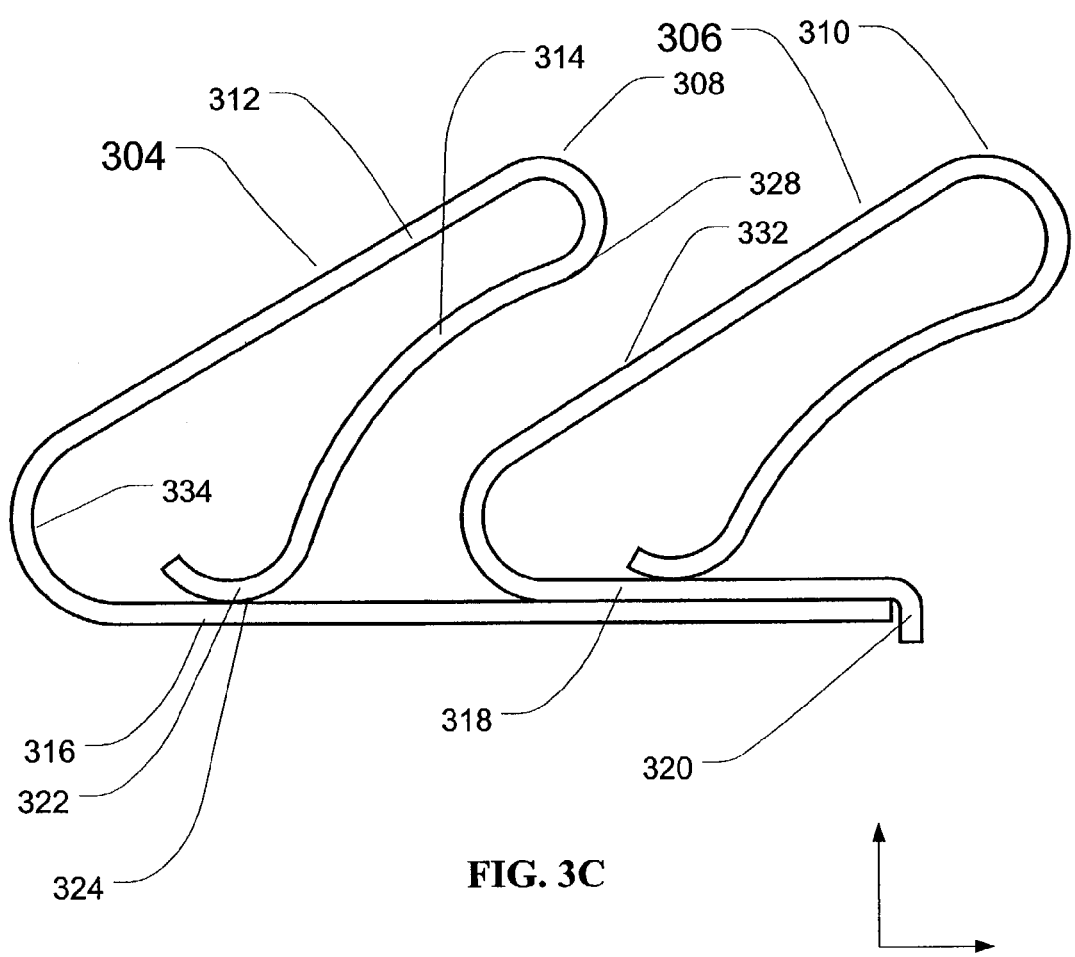
FIG. 3C is a side view of a double-row loop conductor shown in the non-compressed state.

FIG. 3A shows another micro spring arrangement for a conductor assembly. Micro-spring assembly 300 has dual rows of in-line loop springs or conductors arranged in a carrier 302. In-line loop conductors 304 and 306, for example, are shown in an in-line arrangement and are typically kept at the same electric potential or voltage. FIG. 3B shows an enlarged view of a portion of the micro-spring assembly 300. Conductors 304 and 306 typically have contact points 308 and 310 as were previously described in the earlier figures. Note that this instantiation is shown with loop conductors as well. However, this need not be so. Single beam or multiple-beam versions may be used. FIG. 3C shows a side view of in-line loop conductors 304 and 306 in the uncompressed state. Features of in-line loop conductors 304 and 306 are very similar to previously described loop conductors with some exceptions. Beam 312 of in-line loop conductor 304, for example, is still the primary beam and actuates from end 334. Base 316 is used for soldering or mechanical and electrical attachment to a printed circuit board. Base 318 of in-line loop conductor 306 is typically mated with base 316 of in-line loop conductor 304 and portion 320 is curled over for ease in assembly and alignment but this is not required. Other methods of retaining the conductors to a printed circuit board may be used without departing from the scope of the present invention.

Figure 3D:
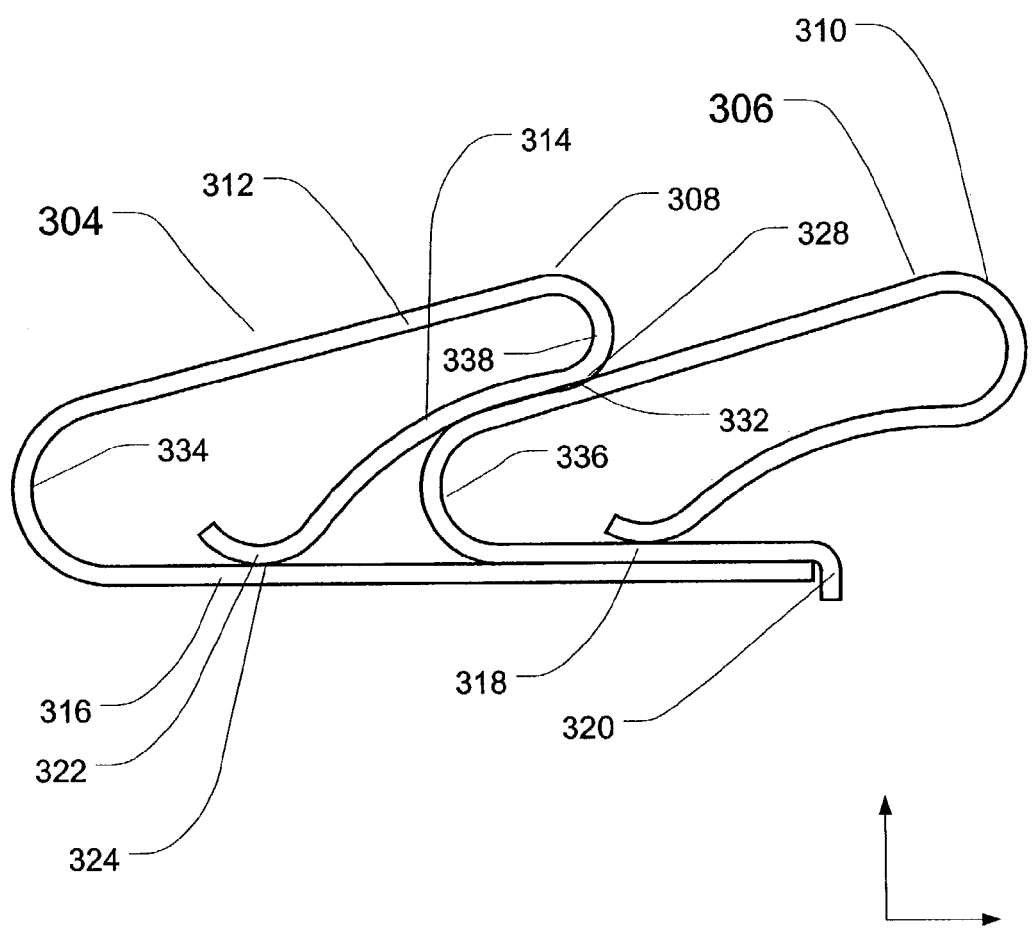
FIG. 3D is a side view of a double-row loop conductor shown in the compressed state.

Secondary contact portion 322 forms an electrical connection and mechanical contact with the base 316. However, additional contact point may be provided on in-line loop conductor 304 such as bottom contact point 328 which mates with back surface 332 of in-line loop conductor 306 when under compression. This is illustrated in FIG. 3D which shows the conductors in compression. Secondary beam 314 is arched to allow for a proper connection between contact 328 and surface 332 while simultaneously clearing end 336 of in-line loop conductor 306. The addition of this contact interface between 328 and 332 allows for additional AC and DC electrical paths through the in-line loop conductors. Care should be taken to allow enough compliancy such that the forces do not get excessive due to the rigidity of end 338 of in-line loop conductor 304 which may reduce travel during compression of the conductor arrays.

Figure 4A:
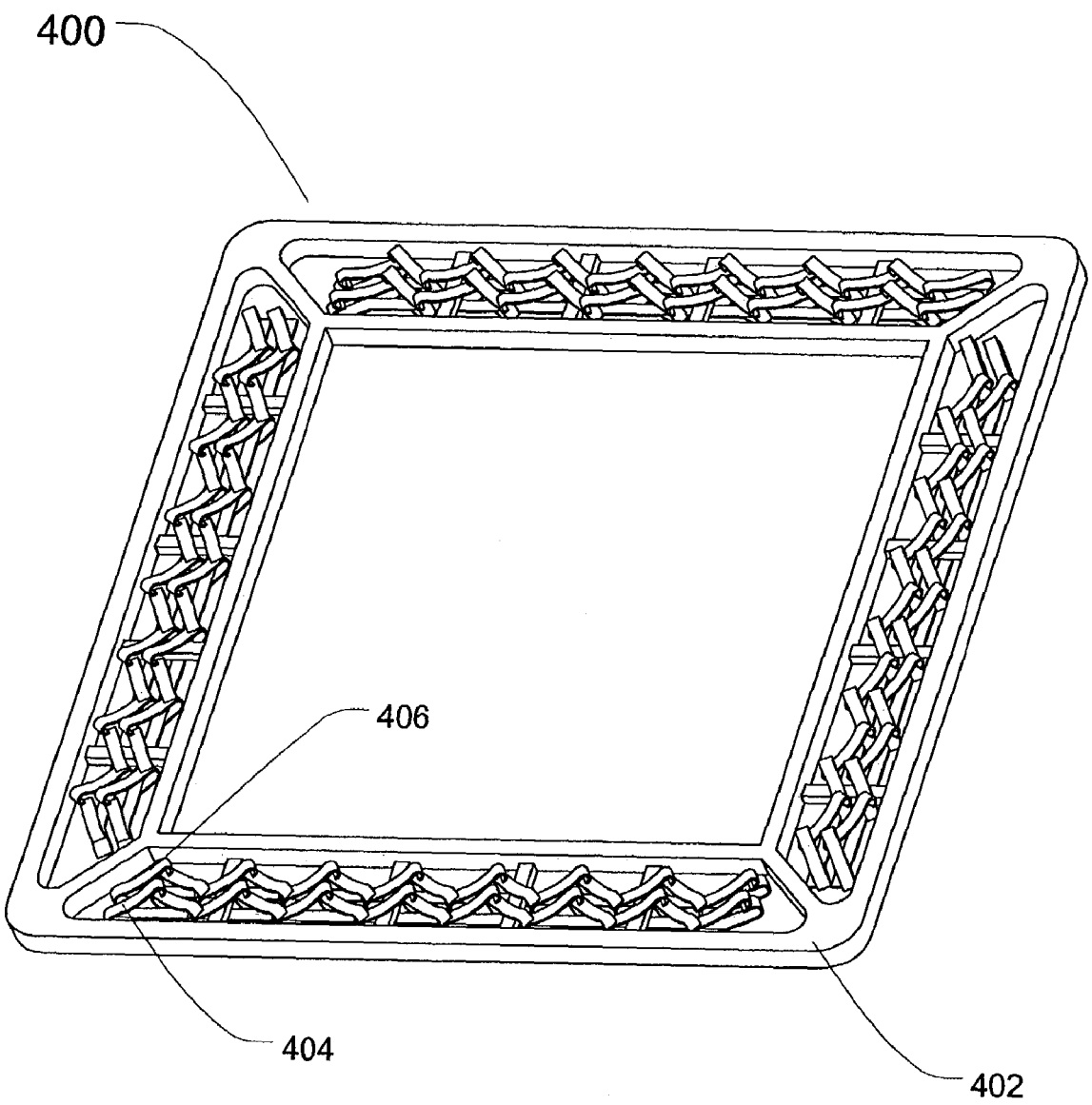
FIG. 4A is an isometric view of a set of link conductors placed in a set of arrays where the spring arrays are arranged circumferentially in a carrier.
Figure 4A:
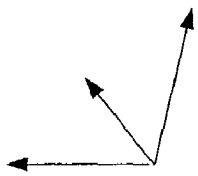
Figure 4B:
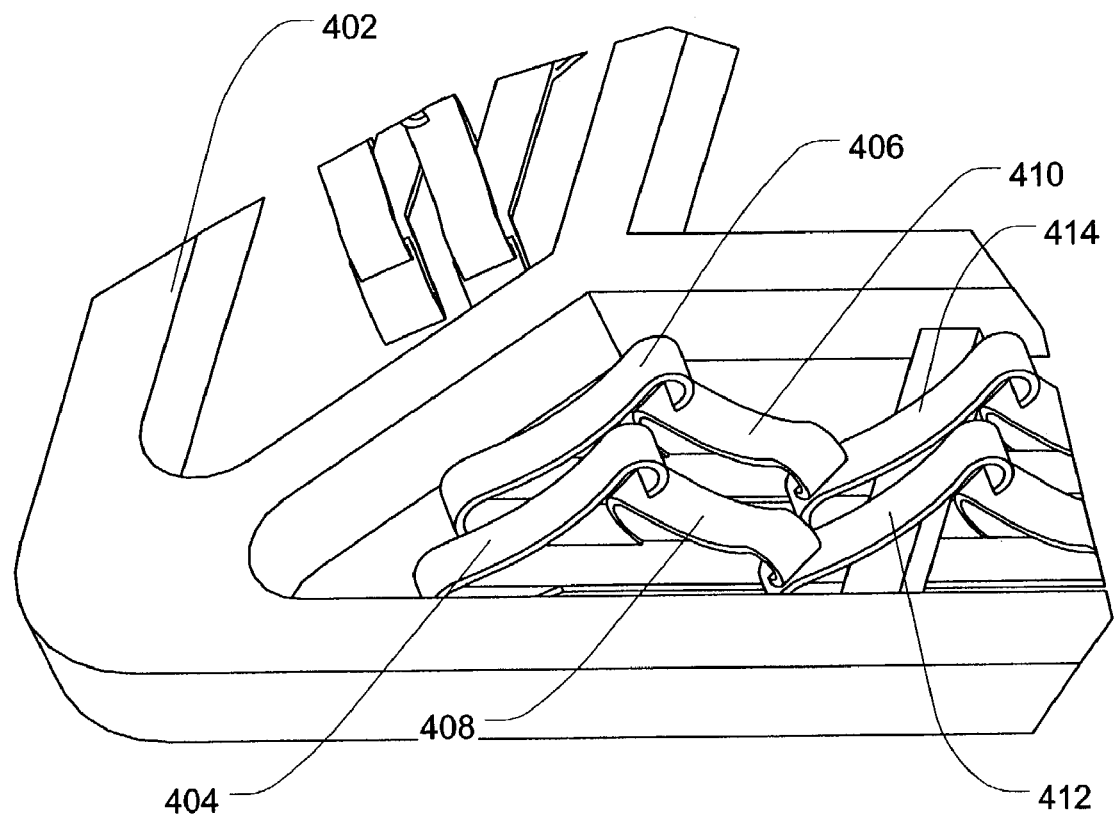
FIG. 4B is a detailed view of a section of the spring arrays shown in FIG. 4A.

FIG. 4A shows another micro-spring arrangement for a conductor assembly. Link-conductor assembly 400 includes 4 pairs of arrays of link-conductor in carrier 402. Link conductors, such as 404 and 406, are typically of different electric potential and are electromagnetically coupled. FIG. 4B shows an enlarged view of a portion of the link-conductor assembly 400. A feature of such a conductor arrangement is that arrays of conductors can be constructed from a common piece of conductive material with each of the link conductors folded over in a repetitive fashion to be 'linked' with the previous conductor. Such a piece of conductive material can be a flat strip of metal having a central strip with small strips extending from the sides of the central strip in an alternating pattern. The small strips are then folded to form the link conductors. For example, after link conductor 412 is folded over, link conductor 408 is folded over in an opposing fashion and a portion of 408 resides above 412. This continues on with link conductor 404 which is folded over in the same direction as 412 and where a portion of 404 resides over link conductor 408. As illustrated in the figure, link conductor 404 and 406, 408 and 410, 412 and 414, form conductor pairs such that each pair is electromagnetically coupled between each other.

Figure 4C:
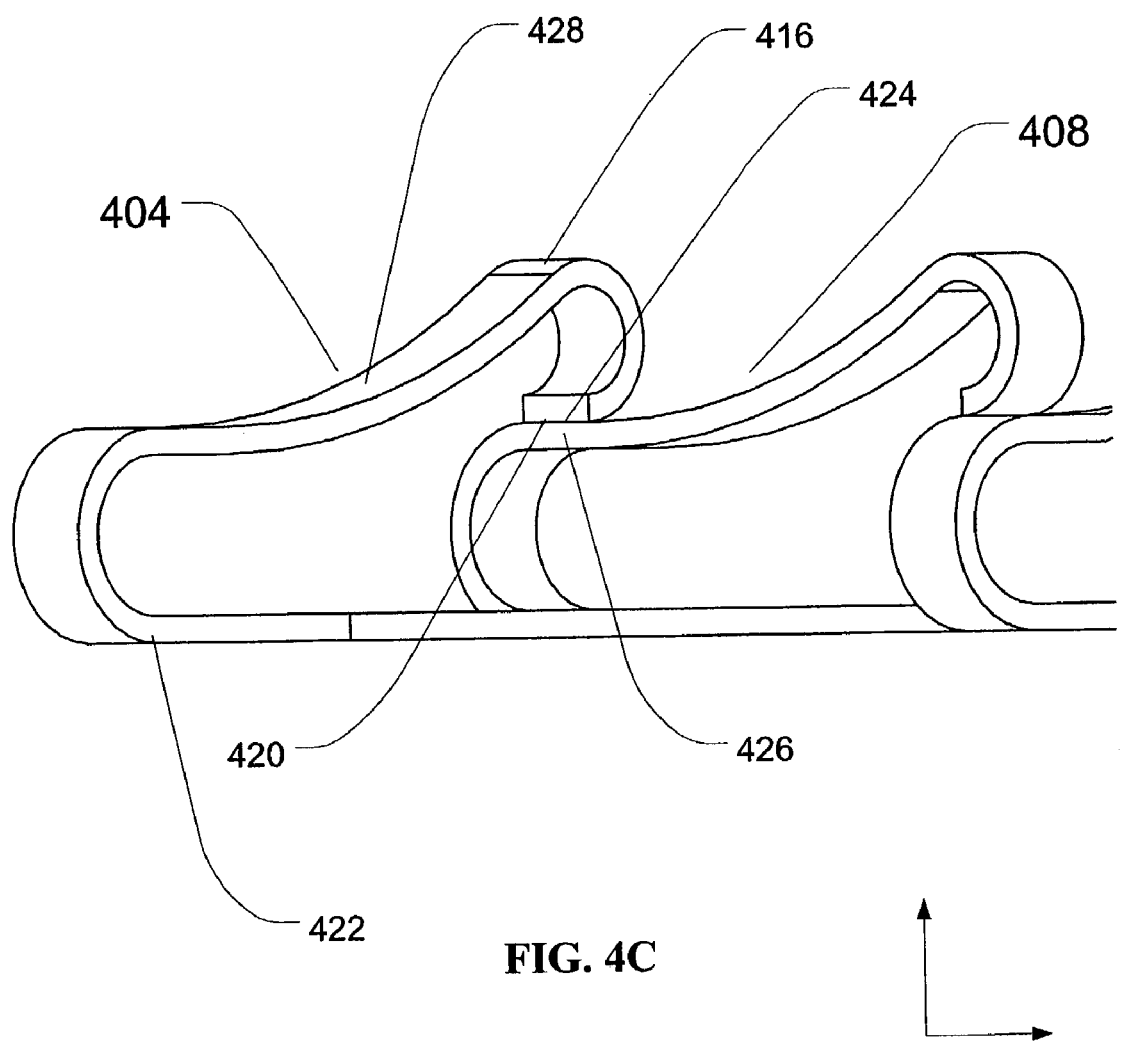
FIG. 4C is a side view of a pair of link conductors shown in a section view.

FIG. 4C illustrates the mechanical formation between conductors 404 and 408 in a side view and under compression. Beam 428 of link conductor 404 is shown with a slight curve allowing for better control of the mechanical forces during compression. Contact point 416 still mates with adjacent pads on a printed circuit board or substrate. A secondary contact of link conductor 404, for example, is now made by secondary contact 424 to the back side of conductor 408 (e.g. point 426), at surface interface 420. The conductor array is typically made from one piece and soldered to a contact of a PCB at base 422 which extends along the link conductor array.

An advantage of such an arrangement is that contiguous pads may be created on the printed circuit board or substrate side and the actual area taken up by such an arrangement on both sides of the link-conductor arrays is quite small. This is often important to help reduce cost of complex and expensive device substrate designs as well as printed circuit board designs where real estate is often limited.

Figure 5A:
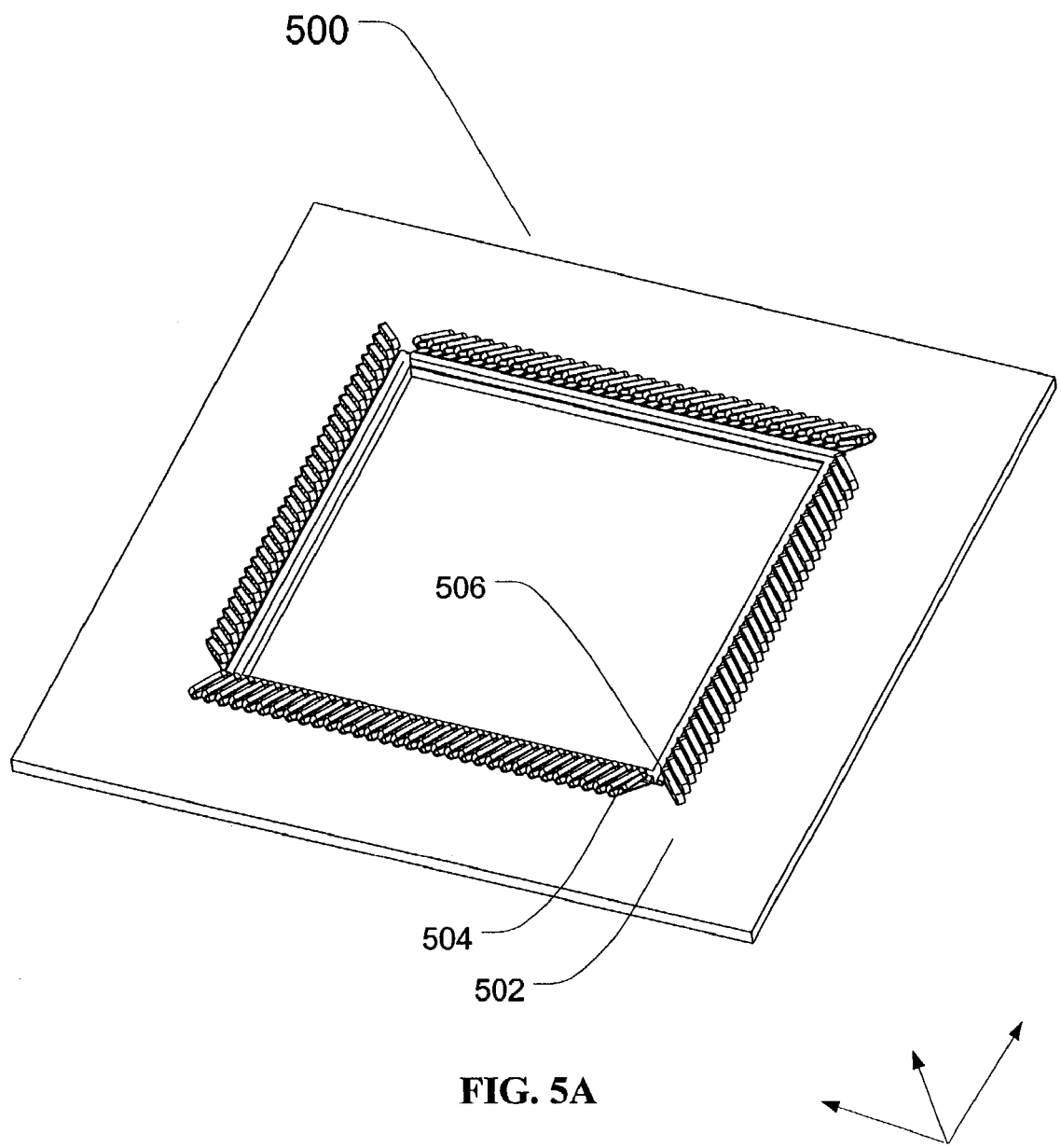
FIG. 5A is an isometric view of a set of skewed in-line loop conductors placed in a set of arrays on a circuit board where the spring arrays are arranged circumferentially in a carrier.
Figure 5B:
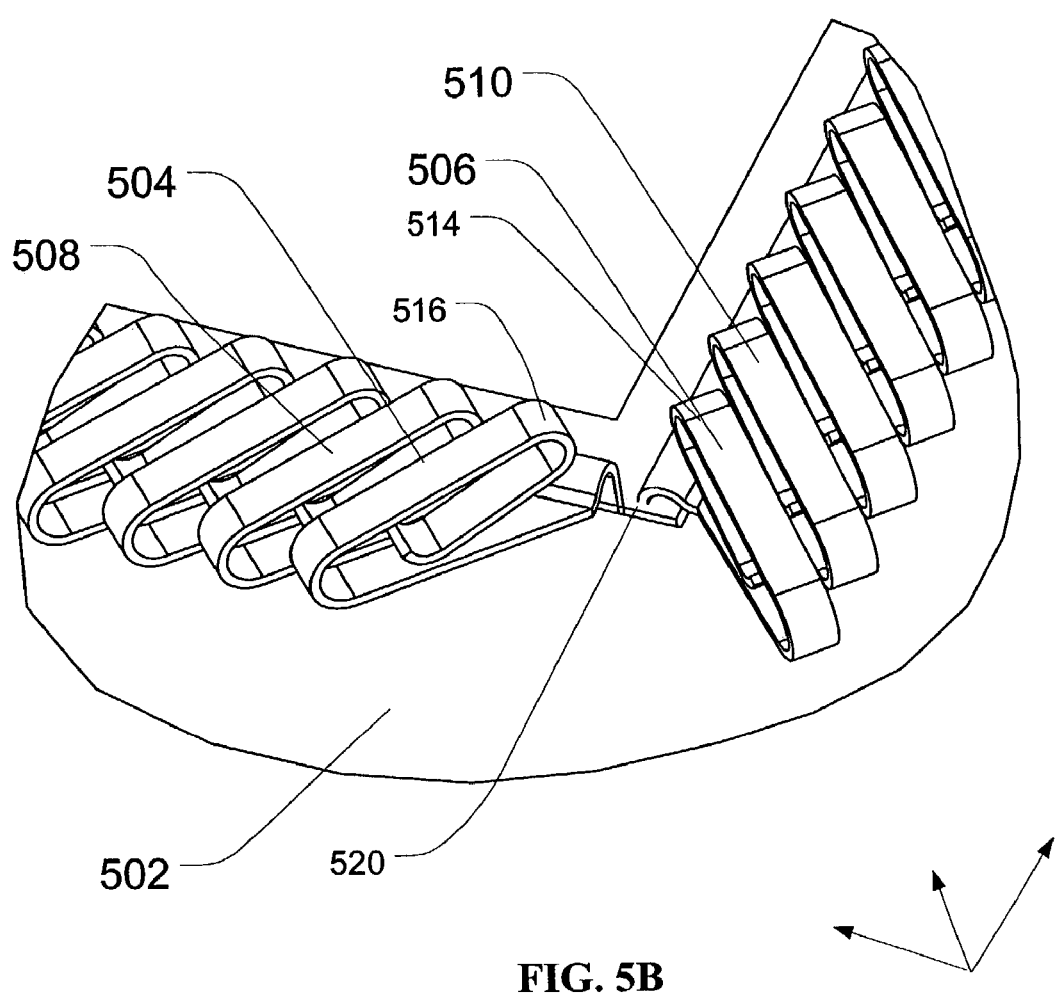
FIG. 5B is a detailed view of a section of the spring arrays shown in FIG. 5A.

FIG. 5A shows another variation of the loop conductor design. Assembly 500 illustrates the use of the micro-springs with a set of arrays mounted on a printed circuit board. Skew-conductors, in the form of in-line loop conductors, 504 and 506 are typically mounted on a printed circuit board 502. This is similar to the way previous instantiations are also mounted to printed circuit boards but was not shown for clarity in illustrating the different assemblies. FIG. 5B shows an enlarged section of the assembly 500. Conductors 504 and 508 are typically coupled electromagnetically as are conductors 506 and 510. As with all of the described examples, this pattern can then be repeated throughout the assembly. Similar to the other loop conductor assemblies described earlier, primary contact is made to pads on a PCB or substrate (not shown) at contact points 516 and 514 with skew-conductors 504 and 506 respectively. Skew-conductors, such as skew-conductor 506, are typically attached to a carrier, such as carrier 520, but this need not be so. Other variations of mechanical attachment may be used.

Figure 5C:
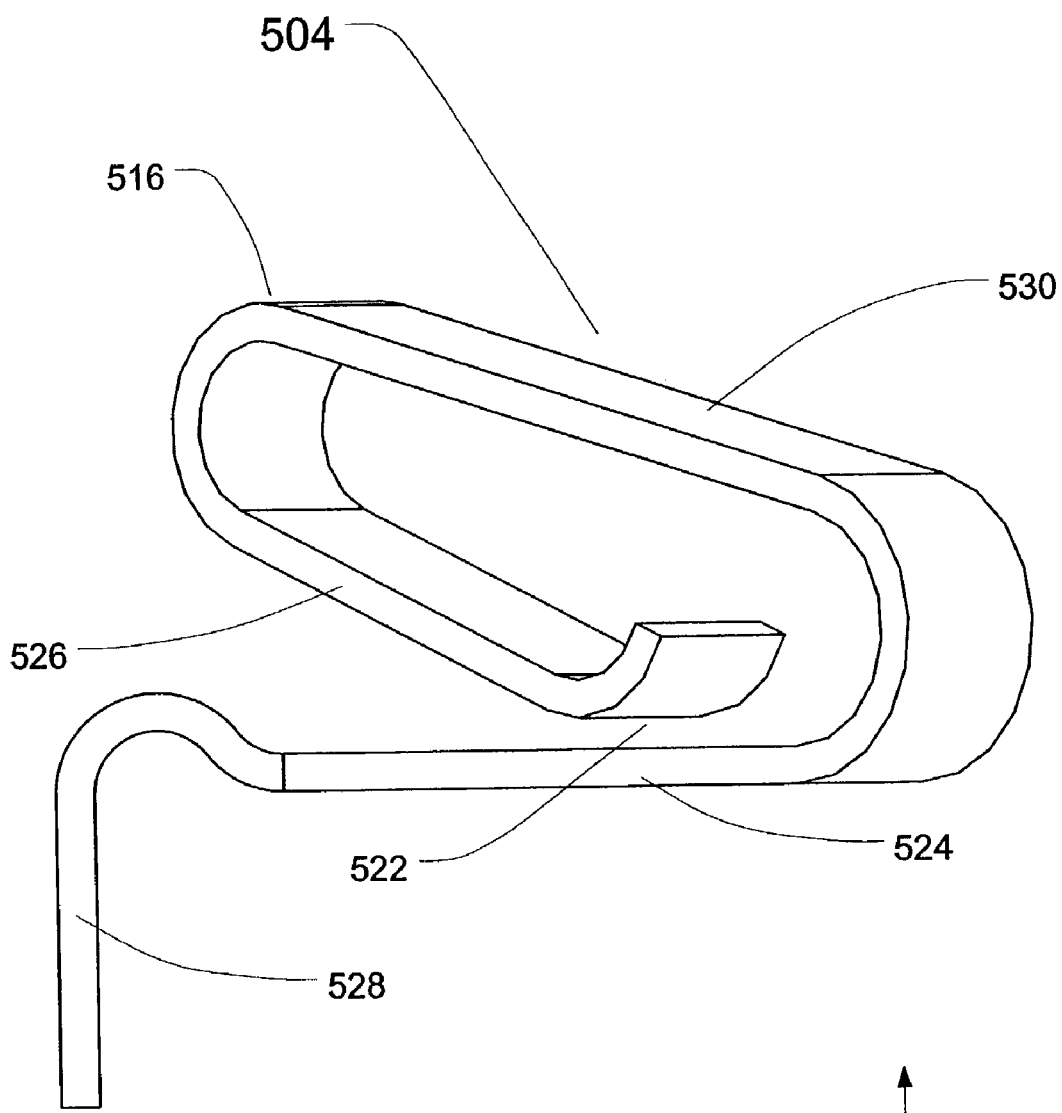
FIG. 5C is a side view of a single skewed in-line loop conductor.

FIG. 5C illustrates a side view of the skew conductor which is very similar to previous versions of the in-line loop conductors. Skew-conductor 504 has contact point 516 which is the primary contact on primary beam 530 with secondary contact point 522 of secondary beam 526 being made to base 524. Tab 528 may be used for connection with a carrier such as carrier 520. The skew conductor is typically used for reducing the physical space on the printed circuit board and substrates where the conductors are mated and/or where they reside. Skewing such conductor arrangements allows for similar performance to an in-line arrangement but with a smaller form factor. Additionally, actuation (compression) of such conductors allows for a reduced pad arrangement in the direction orthogonal to the direction of actuation or compression. That is, the conductor actuates at an angle to the substrate or printed circuit board surface which is advantageous to keeping the mating pad sizes smaller on these surfaces.

Figure 6A:
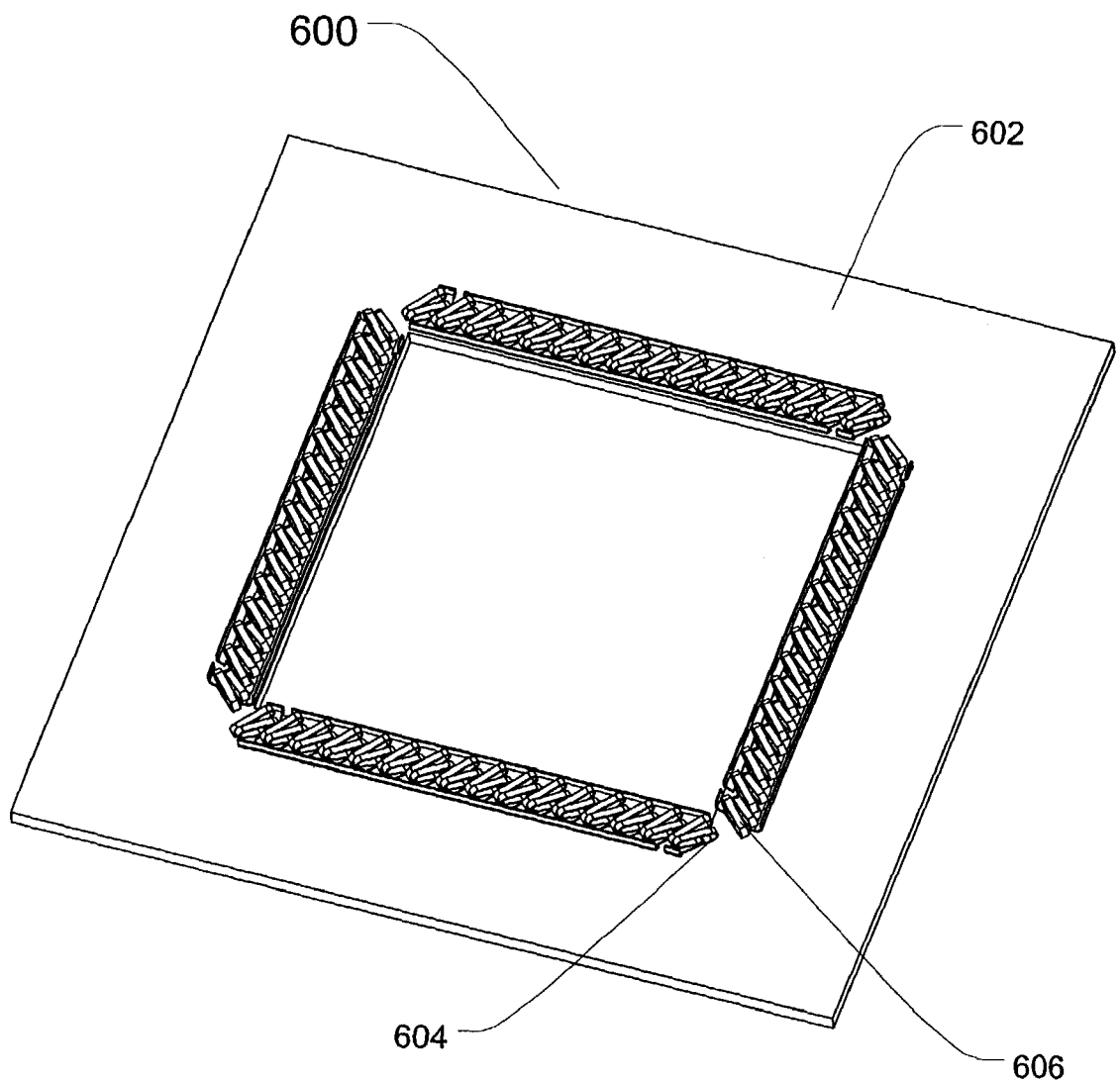
FIG. 6A is an isometric view of a set of skewed scissor loop conductors placed in a set of arrays on a circuit board where the spring arrays are arranged circumferentially in a carrier.
Figure 6B:
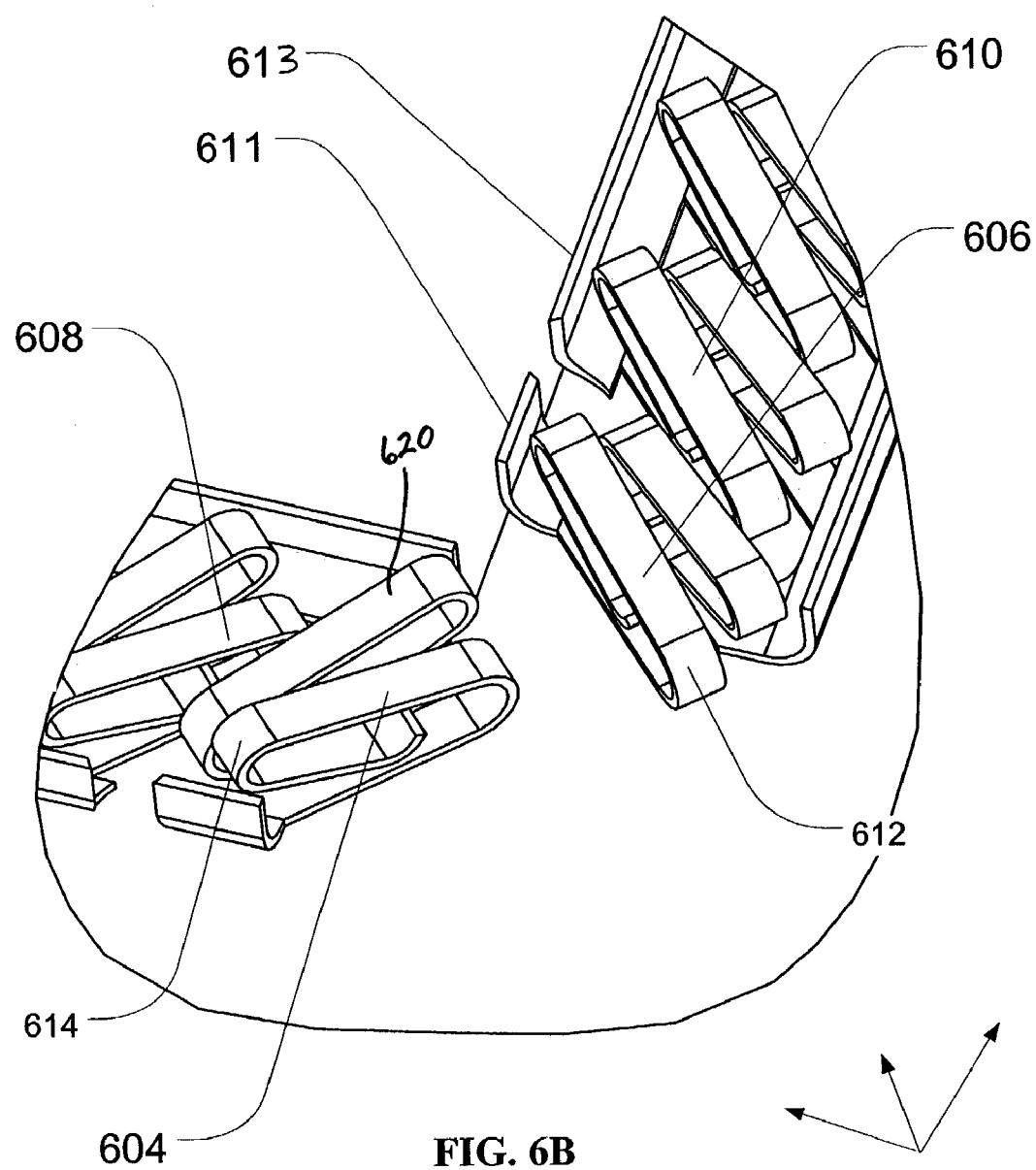
FIG. 6B is a detailed view of a section of the spring arrays shown in FIG. 6A.

FIG. 6A illustrates a skew conductor assembly in a scissor arrangement. Assembly 600 has scissor-arranged skew-conductor arrays, such as skew-conductors 604 and 606, located on a printed circuit board 602. FIG. 6B shows an enlarged portion of the assembly 600 emphasizing the skew-conductor configurations themselves. Note that conductors 604 and 606 are shown electrically separate from conductors 610 and 608, for example. This is to illustrate that the scissor arranged conductors can be constructed to be used for the distribution of signals in addition to power distribution. Conductor contact points 614 and 612, for example, can mate with a pad which is connected to a signal rather than power. Scissor conductors 606 and 610 may also be fabricated on common conductive carriers such as carriers 611 or 613 respectively. Such carriers may be constructed such that the carriers themselves are common and then portions of conductor arrays or single conductors may be separated and then placed on a printed circuit board. This is illustrated in the instantiation of carriers 611 and 613 where it is shown that carrier 611 is attached to skew-conductor 606 in an independent fashion while carrier 613 is connected to multiple conductors such as skew-conductor 610.

Figure 6C:
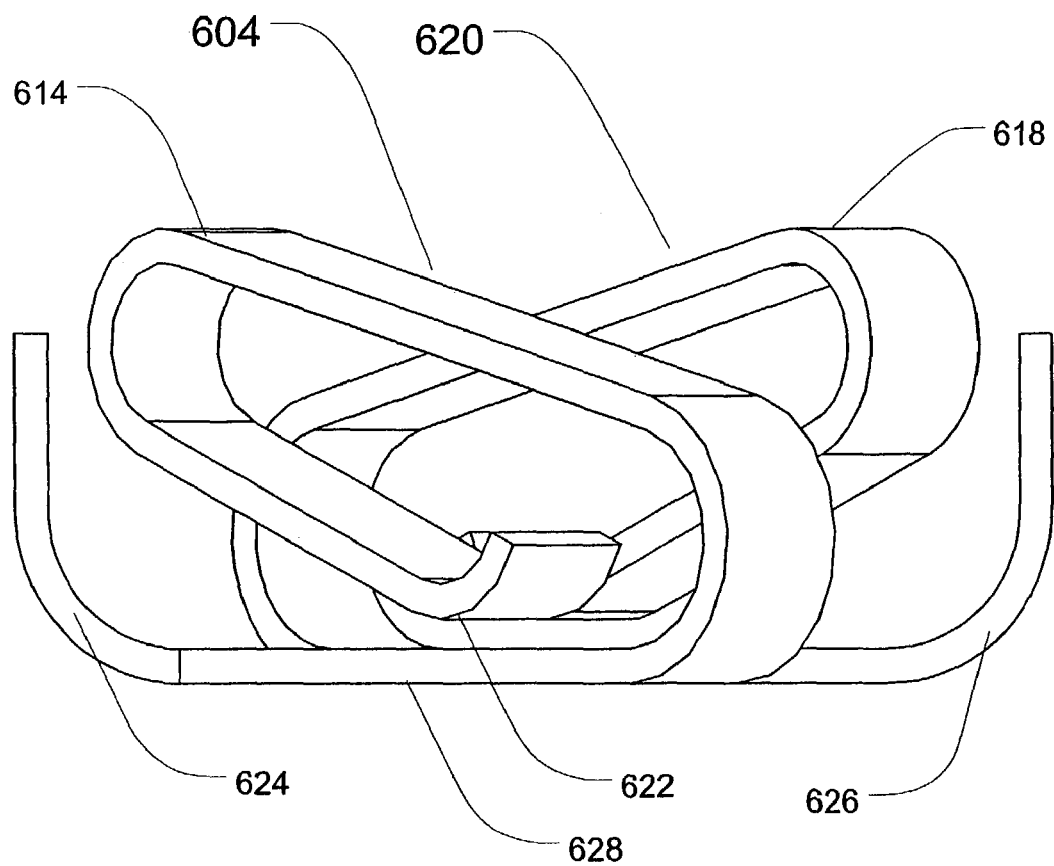
FIG. 6C is a side view of a pair of skewed scissor arranged loop conductors.
Figure 6C:
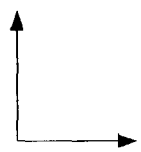

FIG. 6C shows a side view of a pair of scissor arranged skew-conductors. Such an arrangement is similar to a non-skewed scissor conductor arrangement. Secondary contacts, such as secondary contact 622, mates with base 628. In this arrangement, skew-conductor 604 is electromagnetically coupled to skew-conductor 620 with mating primary contacts 614 and 618 respectively. Note that if these were power and ground contacts respectively, that because of the scissor arrangement of the conductors, the pad arrangements from conductor carrier to conductor carrier may be made common. Electrically, these skew-conductors can be fabricated on common carriers for each polarity which are shown here as carriers 624 and 626 where skew-conductor 604 is mechanically and electrically connected to carrier 624 and skew-conductor 620 is mechanically and electrically connected to carrier 626. The conductors can be coupled to the carriers, for example, in the manner described in connection with the earlier examples.

Figure 7A:
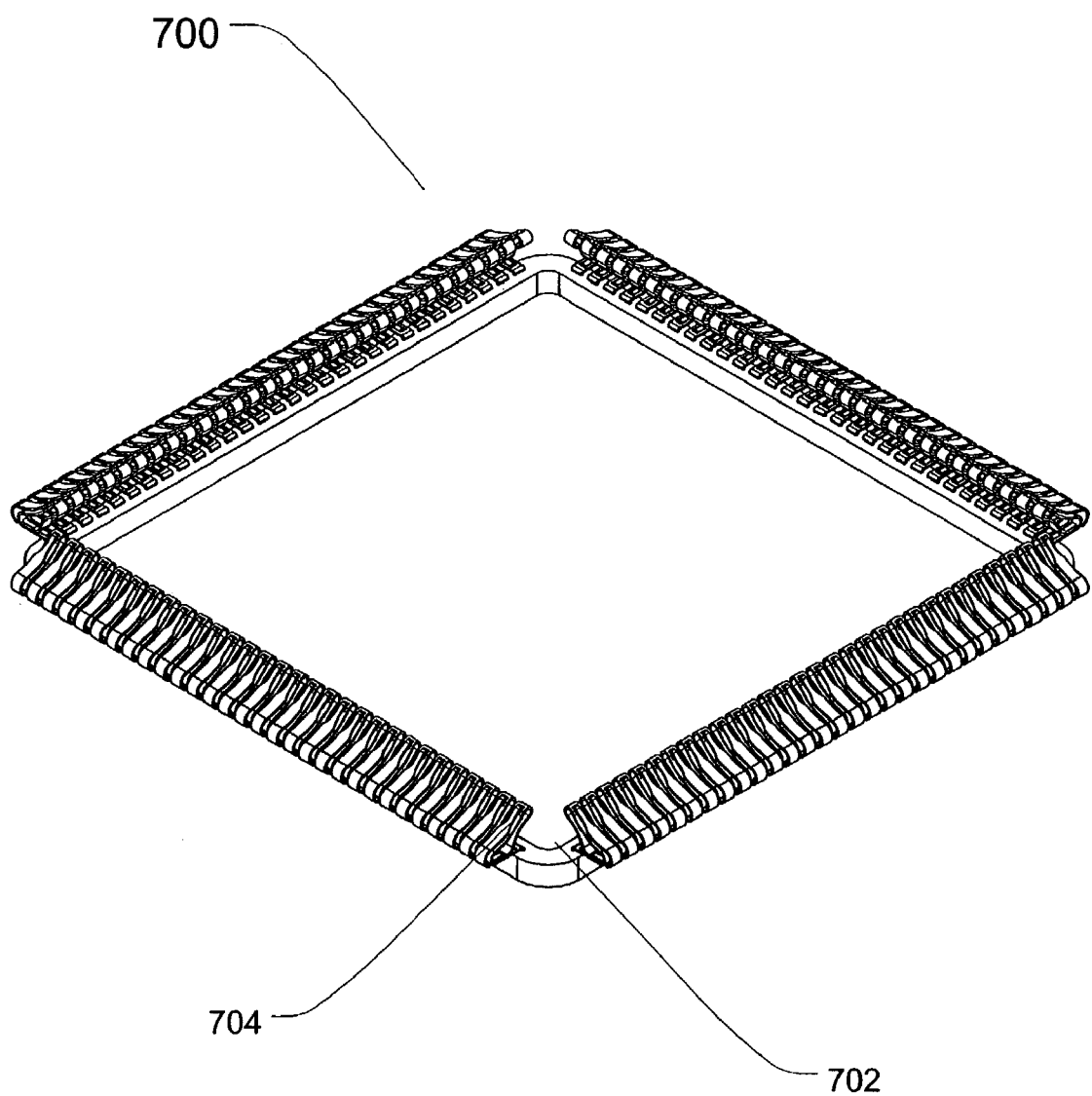
FIG. 7A is an isometric view of a set of triple beams placed in a set of arrays where the spring arrays are arranged circumferentially in a carrier.
Figure 7B:
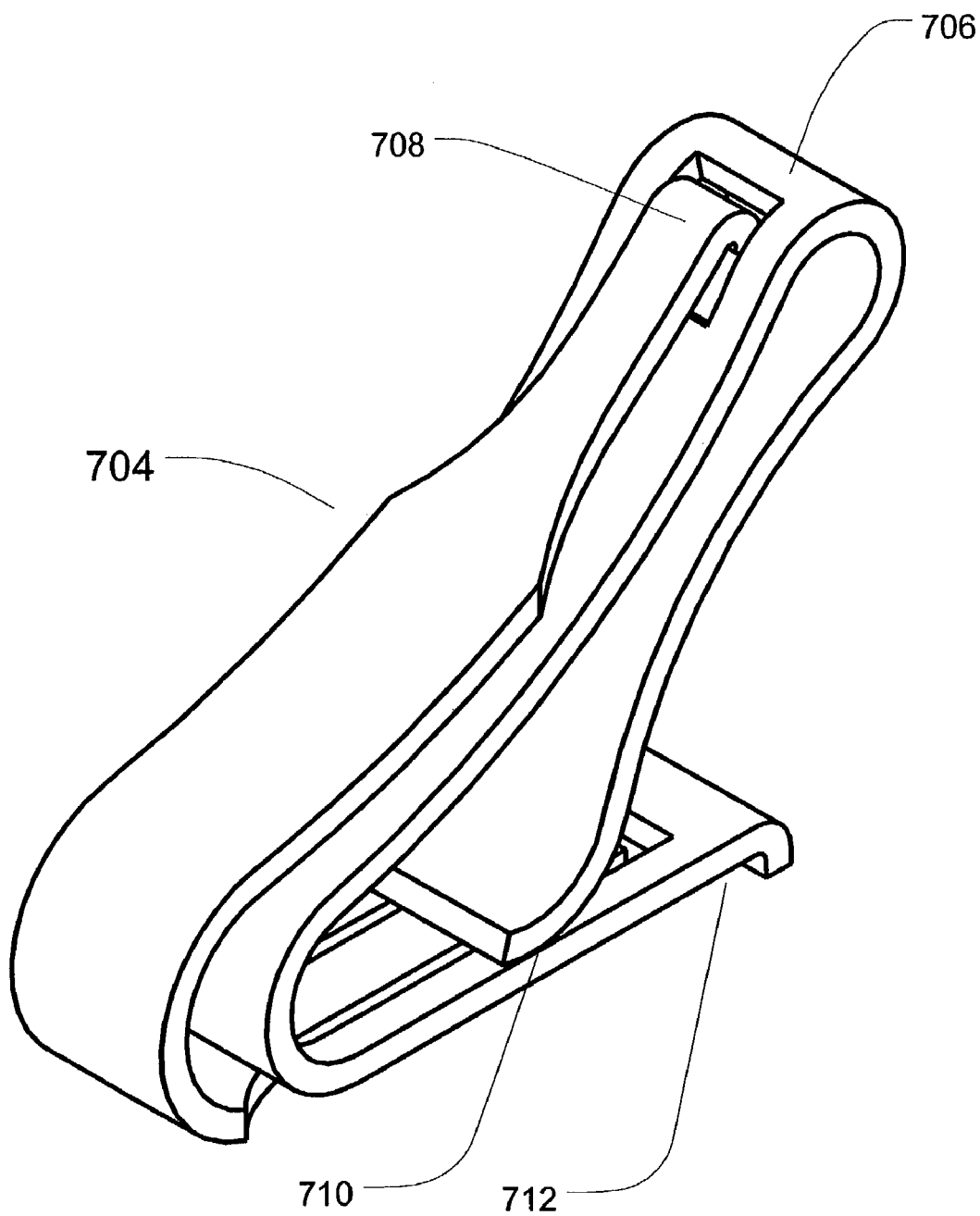
FIG. 7B is an isometric view of a single triple beam.

FIG. 7A illustrates an assembly that is similar to the assembly described in connection with FIGS. 3A thru 3D. Assembly 700 comprises an in-line loop conductor arrangement which includes a single-beam or C-spring to form a triple beam conductor, such as triple beam conductor 704. The triple beam conductors, such as 704, can be coupled to a common carrier 702. FIG. 7B shows an isolated isometric view of a single triple beam conductor 704. Triple beam conductor 704 comprises beams with contact points 708 and 706 which mate to a common pad on a printed circuit board or substrate. Secondary contact 710 mates to base 712 and is similar to the previous descriptions of in-line loop conductor secondary contact arrangements.

Figure 7C:
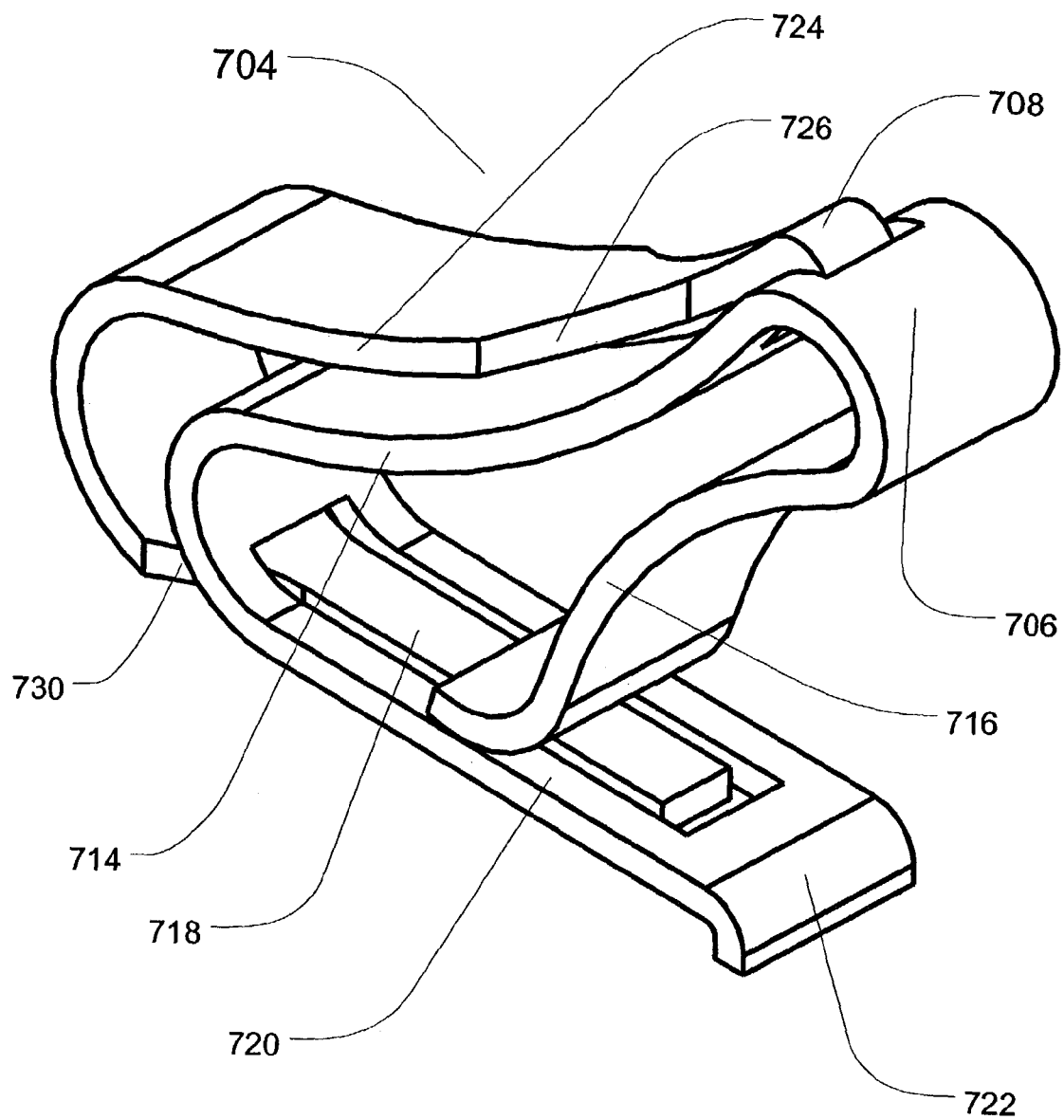
FIG. 7C is another angle of an isometric view of a single triple beam.

FIG. 7C shows another isometric view of the triple-beam arrangement and FIG. 7D shows a side view of the same arrangement. Contact point 708 is connected to egress section 726 which tapers to allow for mechanical separation from the opening in beam 714. Primary beam 724 loops to base section 718 and has egress 730 to allow for mechanically 'fitting' the back C-spring portion of triple-beam conductor 704. The egress section 730 and smaller section 718 allow for bringing the beam sections closer together which allows for a reduction in space. However, other methods of placing the beams closer together can be used. For example, tapering the loop beam portion and reducing the center portion of its base 720 rather than base 718 and fitting base 718 about 720 as is shown in FIG. 7C. In-line loop beam still has a secondary beam 716 and a primary contact point 706. Note that base 760 has curved section 722 which may be used for alignment, but again other methods of alignment may be envisioned. Also, note that secondary contact 728 at point 710 may be made to only mate base 720 rather to both base 720 and 718 which is not necessary now since both bases are electrically connected to a printed circuit board pad for electrical and mechanical connection such as a solder pad.

The invention has been shown and described with respect with particular embodiments and examples. However it will be understood by those skilled in the art that various changes may be made therein without departing from the spirit and scope of the invention. For example, the carriers of the various conductor assemblies can themselves be conductive or can include conductive elements coupling selective ones of the conductors to each other. Additionally, the invention includes assemblies such as a voltage regulator module mounted in proximity to a substrate carrying a microprocessor which is in turn mounted to a carrier such as a PCB with a conductor assembly located between the VRM and the processor and providing conductive paths there between.

The scope of the invention is indicated by the appended claims rather then by the foregoing description. All changes which come within the meaning and range of equivalents of the claims are to be embraced within their scope.

What is claimed is:

1. An electronic assembly comprising:
   a power conversion assembly configured to provide power and ground transmissions,
   said power conversion assembly including a substrate with an aperture therein;
   a compliant conductor assembly having a carrier and a plurality of spring conductors mechanically coupled to said carrier, each of said spring conductors being electronically coupled to said power conversion assembly, said plurality of spring conductors configured such that selected ones of said spring conductors are electromagnetically coupled, said carrier being mechanically coupled to said power conversion assembly and substantially surrounding said aperture; and
   an electronic assembly including a microprocessor mounted on a substrate, a plurality of pads electrically coupled to said microprocessor, each of said plurality of pads being in contact with at least one of said plurality of spring conductors to thereby form an electrical path between said electronic assembly and said power conversion assembly.

2. The assembly of claim 1 wherein each of said plurality of spring conductors includes a primary beam, and a base extending from the end of said primary beam with said base being mechanically and electrically coupled to said power conversion assembly, wherein said primary beam is in electrical contact with one of said plurality of pads.

3. The assembly of claim 1 wherein each of said plurality of spring conductors includes a raised contact point.

4. The assembly of claim 1 wherein said compliant conductor assembly includes at least two linear arrays of spring conductors.

5. The assembly of claim 4 wherein said two linear arrays are generally parallel to each other.

6. The assembly of claim 5 wherein each of said plurality of spring conductors includes a secondary beam extending from a first end of said primary beam and a contact point proximate an end of said secondary beam distal from said primary beam, wherein said contact point of said secondary beam is an electrical contact with said base.

7. The assembly of claim 4 wherein said two linear arrays are generally perpendicular to each other.

8. The assembly of claim 7 wherein each of said plurality of spring conductors includes a secondary beam extending from a first end of said primary beam and a contact point proximate an end of said secondary beam distal from said primary beam, wherein said contact point of said secondary beam is an electrical contact with said base.

9. The assembly of claim 1 wherein said compliant conductor assembly includes at least four linear arrays of spring conductors, a first two of said four linear arrays being parallel to each other and another two of said four linear arrays being perpendicular to said first two of said four linear arrays.

10. The assembly of claim 6 wherein said compliant conductor assembly includes at least four linear arrays of spring conductors, a first two of said four linear arrays being parallel to each other and another two of said four linear arrays being perpendicular to said first two of said four linear arrays.

11. The assembly of claim 8 wherein said compliant conductor assembly includes at least four linear arrays of spring conductors, a first two of said four linear arrays being parallel to each other and another two of said four linear arrays being perpendicular to said first two of said four linear arrays.

12. An electronic assembly comprising:
a power conversion assembly configured to provide power and ground transmissions,
said power conversion assembly including substrate with an aperture therein;
a compliant conductor assembly having a carrier and a plurality of spring conductors mechanically coupled to said carrier, each of said spring conductors including a primary beam, and a base extending from the end of said primary beam with said base being mechanically and electrically coupled to said power conversion assembly, and wherein each of said spring conductors is electronically coupled to said power conversion assembly, said plurality of spring conductors configured such that selected ones of said spring conductors are electromagnetically coupled, said carrier being mechanically coupled to said power conversion assembly and substantially surrounding said aperture.

13. The assembly of claim 12 wherein each of said plurality of spring conductors includes a secondary beam extending from a first end of said primary beam and a contact point proximate an end of said secondary beam distal from said primary beam, wherein said contact point of said secondary beam is an electrical contact with said base.

14. The assembly of claim 12 wherein said compliant conductor assembly includes at least two linear arrays of spring conductors.

15. The assembly of claim 14 wherein said two linear arrays are generally parallel to each other.

16. The assembly of claim 15 wherein each of said plurality of spring conductors includes a secondary beam extending from a first end of said primary beam and a contact point proximate an end of said secondary beam distal from said primary beam, wherein said contact point of said secondary beam is an electrical contact with said base.

17. The assembly of claim 16 wherein said compliant conductor assembly includes at least four linear arrays of spring conductors, a first two of said four linear arrays being parallel to each other and another two of said four linear arrays being perpendicular to said first two of said four linear arrays.

18. The assembly of claim 12 wherein said two linear arrays are generally perpendicular to each other.

19. The assembly of claim 18 wherein each of said plurality of spring conductors includes a secondary beam extending from a first end of said primary beam and a contact point proximate an end of said secondary beam distal from said primary beam, wherein said contact point of said secondary beam is an electrical contact with said base.

20. The assembly of claim 19 wherein said compliant conductor assembly includes at least four linear arrays of spring conductors, a first two of said four linear arrays being parallel to each other and another two of said four linear arrays being perpendicular to said first two of said four linear arrays.

21. The assembly of claim 12 wherein said compliant conductor assembly includes at least four linear arrays of spring conductors, a first two of said four linear arrays being parallel to each other and another two of said four linear arrays being perpendicular to said first two of said four linear arrays.

22. The assembly of claim 12 wherein each of said plurality of spring conductors includes a raised contact point.

* * * * *